United States Patent [19]
Akiyama et al.

[11] Patent Number: 5,176,310
[45] Date of Patent: Jan. 5, 1993

[54] METHOD AND APPARATUS FOR WIRE BOND

[75] Inventors: Yukiharu Akiyama, Koganei; Yoshio Oshima, Tokorozawa, both of Japan

[73] Assignee: Hitachi, Ltd., Tokyo, Japan

[21] Appl. No.: 836,156

[22] Filed: Feb. 18, 1992

Related U.S. Application Data

[60] Continuation of Ser. No. 692,913, Apr. 29, 1991, Pat. No. 5,110,032, which is a division of Ser. No. 442,149, Nov. 28, 1989, Pat. No. 5,037,023.

[30] Foreign Application Priority Data

Nov. 28, 1988 [JP] Japan .................................. 63-299936
Feb. 13, 1989 [JP] Japan .................................... 1-33426

[51] Int. Cl.$^5$ ............................................. H01L 21/60
[52] U.S. Cl. ...................................... 228/179; 228/4.5
[58] Field of Search ................ 228/110, 111, 179, 1.1, 228/4.5, 904; 219/56.21, 56.22

[56] References Cited

U.S. PATENT DOCUMENTS

| 4,998,002 | 3/1991 | Okikawa et al. ................. | 219/56.22 |
| 5,095,187 | 3/1992 | Gliga .................................... | 228/4.5 |

FOREIGN PATENT DOCUMENTS

| 60-3134 | 1/1985 | Japan . |
| 60-158637 | 8/1985 | Japan . |
| 62-254441 | 11/1987 | Japan . |
| 63-182828 | 7/1988 | Japan . |
| 63-182829 | 7/1988 | Japan . |
| 63-187639 | 8/1988 | Japan . |

Primary Examiner—Samuel M. Heinrich
Attorney, Agent, or Firm—Antonelli, Terry, Stout & Kraus

[57] ABSTRACT

The present invention relates to a ball bonding technique using an insulated wire in assembling a semiconductor chip in which the ball is formed at the end of an insulated wire by an electrical discharge and the insulation at a portion of the wire to be bonded a predetermined distance from one end of the wire is removed by an electrical discharge.

12 Claims, 23 Drawing Sheets

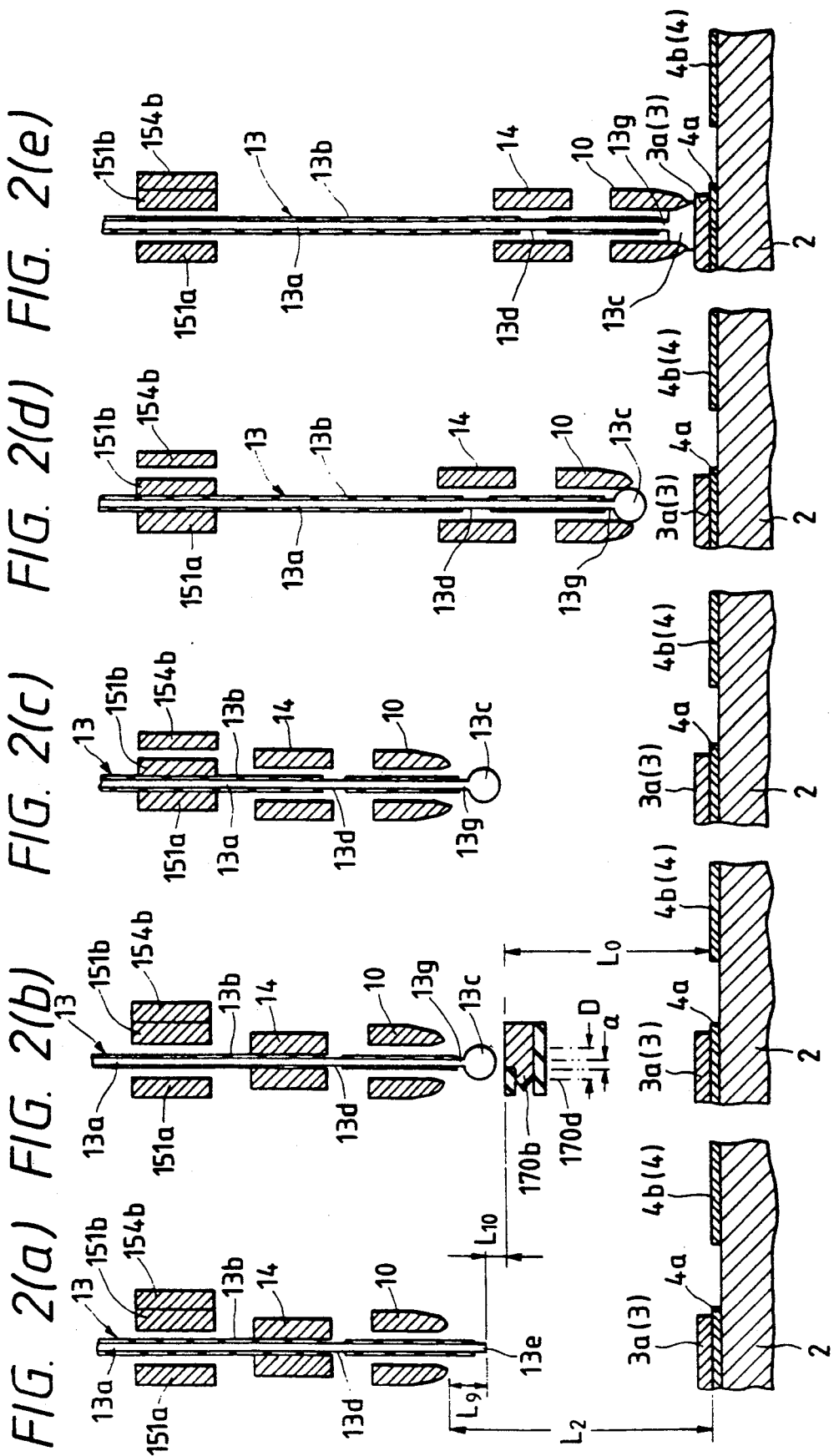

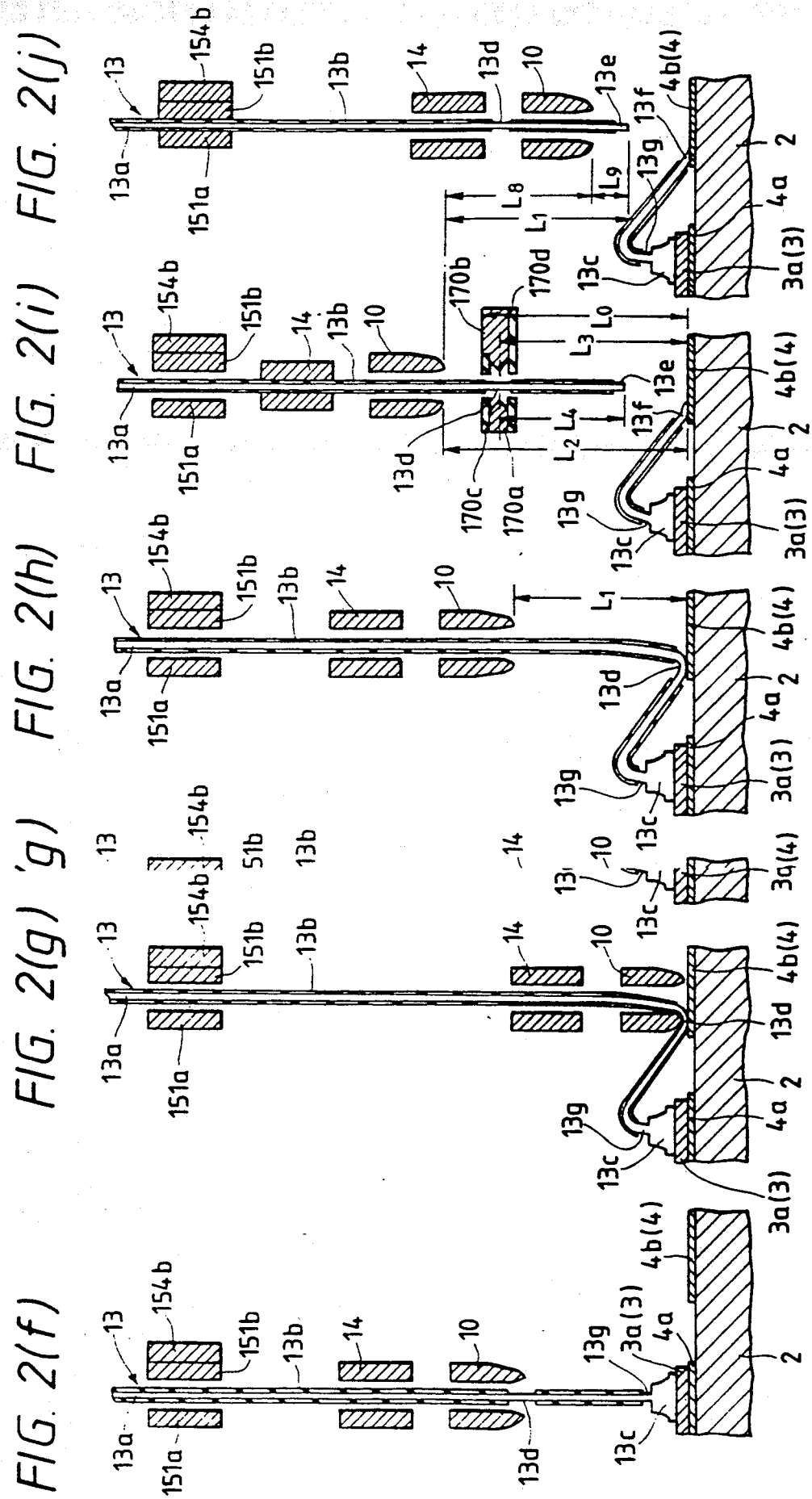

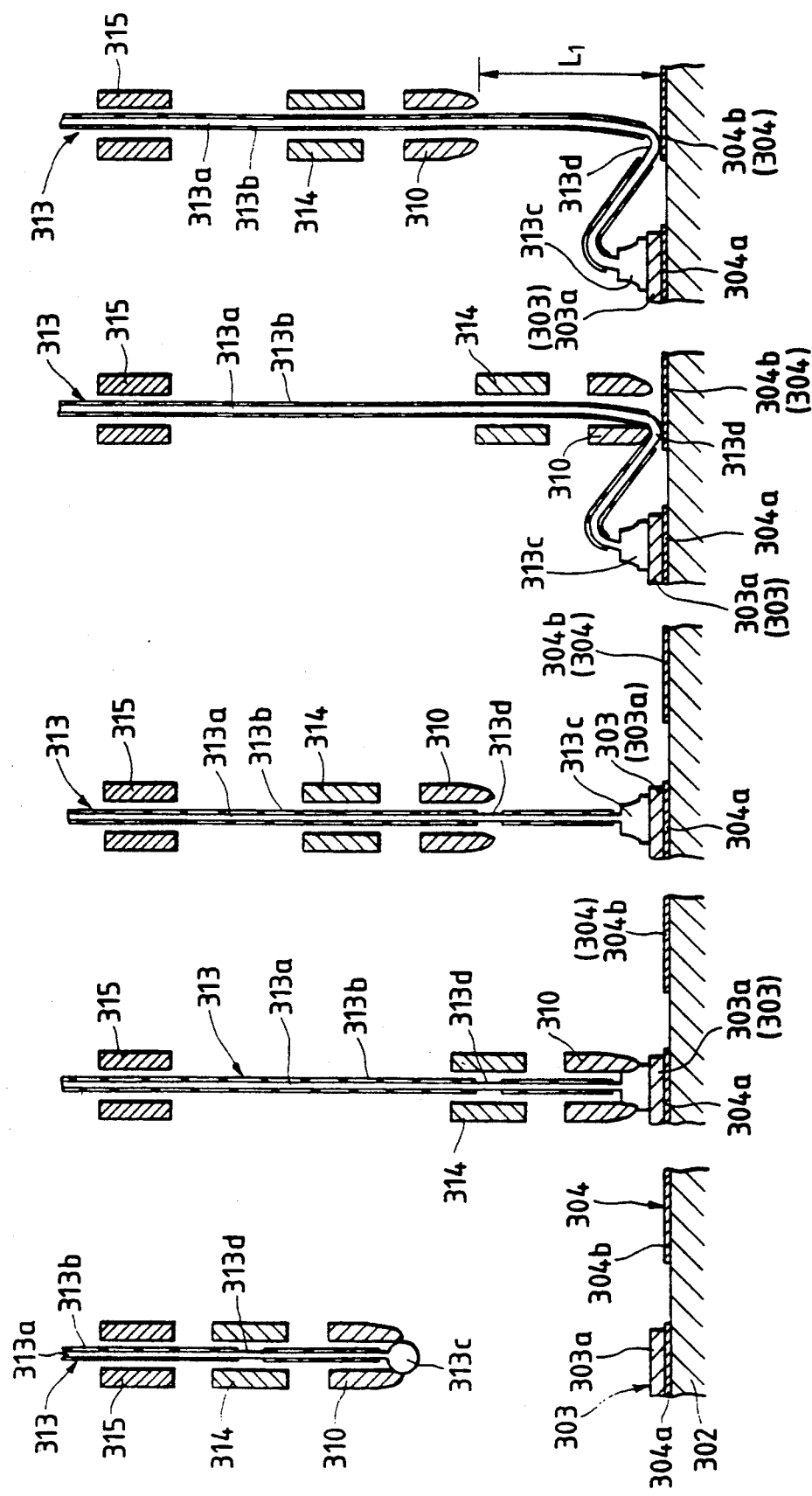

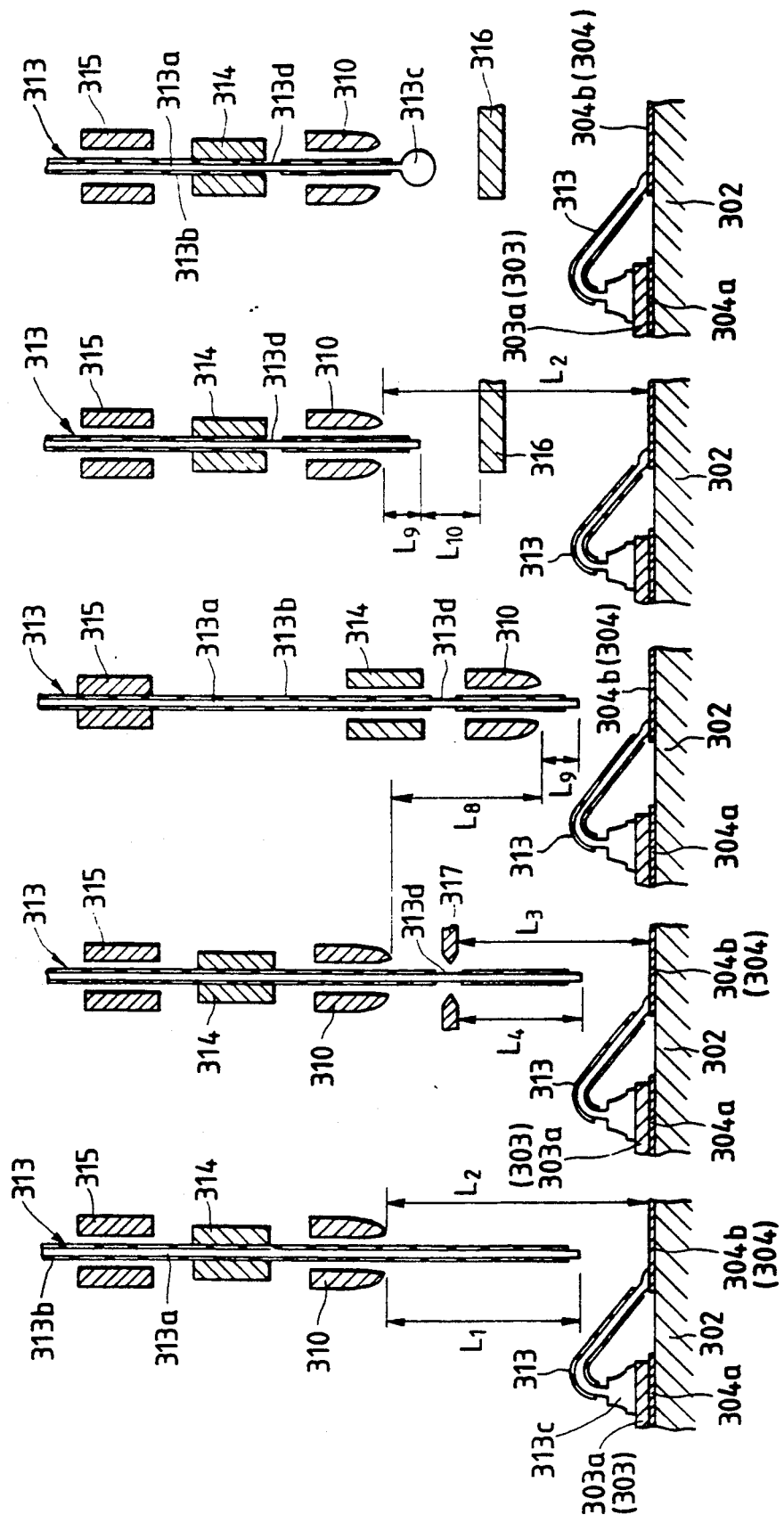

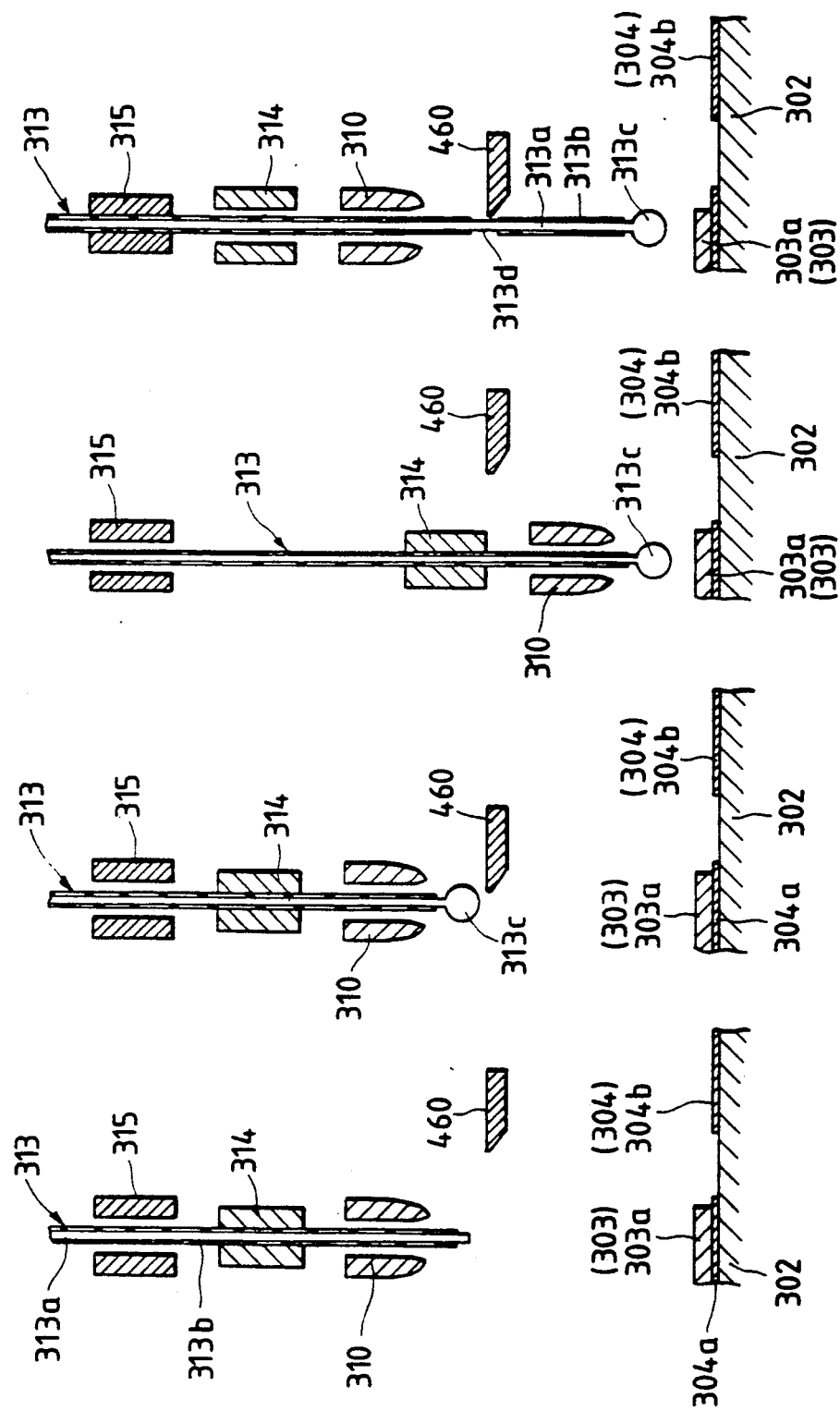

METHOD AND APPARATUS FOR WIRE BOND

This is a continuation application of U.S. Ser. No. 07/692,913, filed Apr. 26, 1991; which is a divisional application of U.S. Ser. No. 442,149, filed Nov. 28, 1989 which is now U.S. Pat. No. 5,037,023.

BACKGROUND OF THE INVENTION

The present invention relates to a technique for wire bonding and more particularly to a technique effective for use in a wire bonding process in assembling a semiconductor integrated circuit device using an insulated wire.

In the fabrication of a semiconductor integrated circuit devices, the process of wire bonding is known which wires conductive metal wires for connecting a plurality of electrodes for external connection disposed on a semiconductor chip on which predetermined integrated circuits are formed to a plurality of leads functioning as terminals for external connection when the semiconductor chip is mounted.

To meet the increasing demands of late for higher packaging density and smaller size of semiconductor integrated circuit devices, the density of the externally connected electrodes is increasing greatly, and hence, the spacing between the bonding wires and diameter of the bonding wires is decreasing. As a result, problems arise such as the occurrence of short circuiting between bonding wires and abnormalities due to deterioration in rigidity of the bonding wire.

To cope with such problems, it is known in the art of wire bonding to use an insulated wire formed of a metallic core wire covered with an insulating film.

In the well known ball bonding technique, the end of a wire passed through a bonding tool such as a capillary is melted and formed into a ball and then bonded to a contact area. But in the bonding of the wire to the side of a lead, an area of the peripheral surface of the wire covered with an insulating film is compression-bonded to the surface of the lead. Therefore, it is expected that the bonding strength is lowered, the electric resistance is increased, and reliability of the bonding is lowered.

In view of these problems, there have been disclosed improved methods for wire bonding using an insulated wire, particularly for the bonding to the side of the lead, in Japanese Laid-open Patent Publication Nos. 62-140428 and 62-104127.

The former improved method is such that the pressure provided through the bonding tool, when an insulated wire is bonded to the lead side, is progressively increased in multiple steps so that the nonconductive insulating film existing between the core wire of the insulated wire and the lead is removed and thereby a reliable bond is obtained.

The latter improved method is such that when a capillary with the insulated wire is passed therethrough and an insulated wire is bonded to the lead side, the wire is heated and also given vibration so that the insulating film existing between the core wire of the insulated wire and the lead is removed and a reliable bond is obtained.

SUMMARY OF THE INVENTION

In accordance with the invention, when an insulated wire is bonded to the lead, the bonding is started as with the above described prior art with the insulating film existing between the materials to be bonded together. According to studies made by the present inventor, there is a theory that foreign materials are produced from the insulating film being thermally changed in quality which remain between the core wire and the lead which result in deterioration in the bonding strength or an increase in electric resistance that prevents a reliable bond from being obtained.

Since in both of the above described methods, bonding is performed with the insulating film existing between the core wire of the insulated wire and the bonding tool, pieces of the insulating film peeled off the wire or other foreign materials produced by the applied bonding heat will cost the wire insertion portion of the bonding tool, causing contamination which prevents the insulated wire from being smoothly delivered and pulled back therethrough. Thus, achievement of stabilized bonding becomes difficult.

The present invention was made in view of the above mentioned problems and has the following objects.

A first object is to provide a wire bonding process whereby a reliable bond can be produced between an insulated wire and a lead without having an apparatus of complex structure.

A second object is to provide a wire bonding process in which contamination of the bonding tool resulting from the insulating film of the insulated wire is prevented so that stabilized wire bonding operation can be performed.

A third object is to provide a wire bonding process with stabilized operation delivering and pulling back the wire.

A fourth object of the present invention is to provide a wire bonding with a bonding ball in which formed stabilized ball formation is achieved at all times.

A further object of the present invention is to provide during a wire bonding process a reliable bond between an area of the peripheral surface of an insulated wire and a lead.

The above and other objects and novel features of the present invention will be made more apparent from the description given hereinbelow and the accompanying drawings.

Representative aspects of the present invention disclosed herein are generally summarized as follows.

First, an insulated wire of a length determined to be required by a calculation based on position information is drawn out of the front end of the bonding tool, a discharge is produced between the core wire of the insulated wire at a second portion to be bonded and a discharging electrode through the insulating film so that an area of the insulating film is removed by energy of the discharge to expose a core of the wire Thereafter a discharge is produced between the core wire at a front end of the insulated wire at a first portion to be bonded and the aforesaid discharging electrode so that insulation at the front end is removed and the core is melted into a ball. Thereafter, the ball is bonded to a first position and subsequently, the exposed portion of the insulated wire drawn out of the bonding tool is bonded to the second position.

To attain the above feature, the apparatus is provided with a discharging electrode movable between a position immediately below an end of the insulated wire at a first portion of the wire to be bonded of the insulated wire passed through the bonding tool and a position close to a peripheral surface of the insulated wire at a second portion of the wire to be bonded. Further, at the time of the discharging, a gas is blown to the surface of the discharging electrode.

An urging force is imposed on the wire at its portion between a spool and the bonding tool in a direction substantially orthogonal to a radial direction of the wire so that tension is applied to the wire in a direction opposite to a direction of movement toward a bonding position. Simultaneously, the condition of the wire at the position where the urging force is imposed is observed by a detection to detect a slackening of the wire, and rotation of the spool is controlled according to the result of the detection so that the slackening of the wire may be kept at a constant state at all times.

During the course of discharging for formation of the ball or removal of the insulating film, the voltage drop, which varies with decrease in the length of the insulated wire wound on a spool of wire as the bonding process of a spool of wire proceeds, is detected and a detected voltage drop is added to a voltage drop across a discharge gap between the discharging electrode and a front end or the second portion of the wire to be bonded of the insulated wire to calculate the voltage to be applied in the time of the next discharge to produce a ball for a subsequent ball bond. The values of voltage drop across the discharge gap are obtained as a function of discharge gap and discharge current.

The bonding tool is horizontally moved and lowered to the second position after the first portion to be bonded of the wire fed from the wire spool and passed through the bonding tool has been bonded to the first position. The wire is then set free from clamping by the bonding tool, the bonding tool is elevated to a predetermined height and tension is applied to the wire in the direction opposite to the second position.

The apparatus for wire bonding is provided with a clamper disposed in the path of the wire between a wire spool and the bonding tool for clamping the insulated wire at its periphery. The clamper is controllable so that it provides at least two steps of clamping force to produce fixed clamping and friction clamping.

After a bonding process of a last wire for a preceding semiconductor chip has been finished, the insulation of the following insulated wire is removed at a second portion of the wire to be bonded at a fixed distance from an end thereof and a dummy bounding is performed to a following semiconductor chip or mounting member and subsequently a bonding process for bonding the first wire to a following semiconductor chip is performed.

According to the above described first aspect of the present invention, since the same discharging electrode is used both for forming the ball and for removing the insulation from the wire, the ball formation and the insulation removal at the first portion to be bonded and the second portion to be bonded are made possible without having an apparatus of complex structure. Therefore, wire bonding providing highly reliable bonds with the use of an insulated wire can be achieved. An arrangement to achieve this objective can be easily embodied by constructing the discharging electrode to be movable between the position immediately below the insulated wire at the first portion to be bonded of the insulated wire and a position close to the periphery of the insulated wire at the second portion to be bonded of the insulated wire. Further, by blowing a gas to the surface of the discharging electrode at the time of discharging, the discharging electrode is prevented from being contaminated to provide a stabilized discharge over a long period of time.

According to the second aspect of the invention, since, the wire tensioning and wire detector means are operative at the same position and at the same time, application of tension to the wire and detection of the wire can be performed at the same position and at the same time. Hence, appropriate control of the rotation of the wire spool can be achieved and the wire can be maintained at a state of constant slackening at all times. Thus, no fluctuation is produced in the tension applied to the wire above the bonding tool and a stabilized bonding operation can be performed.

According to the third aspect of the invention, since an optimum value of applied voltage adjusted with decreasing length of the insulated wire can be supplied at all times, it is possible to form balls of a stabilized size and to remove the insulating film in a stabilized length along the insulated wire. Therefore, highly reliable and stabilized wire bonding can be achieved regardless of the length of the insulated wire wound around the wire spool.

According to the fourth aspect of the invention, since the height of a formed wire loop between the semiconductor chip and a lead frame is made controllable, the length of the wire for forming the wire loop can be steadily controlled. Therefore, the second portion to be bonded (the portion where the insulating film is to be removed) can be set with high precision. Further, since the apparatus is provided with a clamper controllable having at least two steps of clamping force providing fixed clamping and frictional clamping, elevation of the wire with the clamper and the height of the wire loop are made controllable. Thus, the stretched condition of the wire is made controllable without increasing the number of the clampers According to the fifth aspect of the invention, since the insulation is removed at the second portion to be bonded a fixed wiring distance from the first portion when the wire is to be bonded to a semiconductor chip, a dummy bonding can be performed using the wire. Therefore, a stabilized and appropriate wiring distance is assured for the subsequent bonding using the first wire and the following wires.

Other representative aspects of the invention disclosed herein are summarized as follows.

A method for wire bonding according to the present invention comprises passing an insulated wire passed through a bonding tool, bonding a front end of the insulated wire to a first position, bonding an area of a peripheral surface of the insulated wire drawn out of the bonding tool to a second position to achieve an electric connection between the first position and the second position The insulated wire is drawn out of a front end of the bonding tool a required length determined by a calculation based on the first and second positions, a discharge is produced between a core of the wire at a portion to be bonded to the second position through the insulation to a discharging electrode so that the insulation is removed by energy of the discharge and an exposed portion of the core is formed and the exposed portion is bonded to the second position The apparatus for wire bonding according to the present invention comprises a bonding tool with an insulated wire passed therethrough and movable in three-dimensions relative to an object and a discharging electrode for producing discharges between an insulated wire and the electrode for bonding a front end of the wire where a ball is formed by a discharge to a first position and bonding an area of a peripheral surface of the insulated wire drawn out of the bonding tool to a second position to electrically connect the first position and the second position. The required length of the insulated wire to be wired between the first and second positions is calculated based o information on individual first and second positions, the insulated wire is drawn out of the front end of the bonding tool the required length based on the resultant calculation, a discharge is produced between the core of the insulated wire at the portion to be bonded to the second position through the insulation to the discharging electrode so that an exposed portion of the core is formed by removal of the insulation by energy of the discharge and the exposed portion is bonded to the second position.

According to the method for wire bonding as described above, since the insulation of the wire at a portion to be bonded is removed and the exposed portion of the core wire is formed before an area of the peripheral surface of the insulated wire is bonded to the second position, it is possible to perform the bonding operation with the core exposed at the exposed portion and the second position by direct contact. Therefore, lowering of the reliability of the bonded portion due to the insulating film coming between the core and the second position is eliminated. Therefore, the reliability on the bond between the periphery of the insulated wire and the second position can be secured.

Further, since the insulation does not come between the core and the second position, foreign materials resulting from peeling off or thermally produced change in the quality of the insulation is greatly reduced. Since the bonding tool presses the core of the insulated wire exposed at the exposed portion directly to the second position, the foreign materials do not contact the bonding tool, providing smooth passage of the insulated wire through the bonding tool and stabilized continuation of the bonding operations is made possible.

Further, according to the apparatus for wire bonding according to the present invention, by suitably independently controlling first and second clampers capable of moving independently of each other delivery of the insulated wire from the bonding tool can be controlled. The exposed portion of the core can be formed by removing the insulation at the portion to be bonded to the second position at a desired distance from the end of the insulated wire prior to the bonding of the peripheral portion of the insulated wire to the second position. Thus, the bonding operation can be performed with the core exposed at the exposed portion and the second position in direct contact. Accordingly, the lowering of the reliability on the bonded portion due to the insulating film coming between the core wire and the second position can be eliminated and the reliability on the bond between the periphery of the insulated wire and the second position can be achieved.

Further, since no insulation is disposed between the core wire and the second position, production of foreign materials resulting from peeling off or thermally caused change in quality of the insulation can be greatly reduced. In addition, the bonding tool can press the core of the insulated wire exposed at the exposed portion formed in advance directly to the second position, without foreign material contacting the bonding tool providing smooth passage of the insulated wire through the bonding tool and stabilized continuation of the bonding operations is made possible.

BRIEF DESCRIPTION OF THE DRAWINGS

FIG. 2 is an explanatory diagram showing positional relationships among the bonding tool and other elements according to steps in the wire bonding process;

FIG. 23(a) to FIG. 23(j) are process diagrams showing an example of operations in another embodiment of the invention;

FIG. 27(a) to FIG. 27(h) are explanatory drawings showing an example of a sequential manufacturing method of wire bonding as an additional embodiment of the present invention.

DETAILED DESCRIPTION OF THE EMBODIMENTS

Embodiment 1

Figure 1:
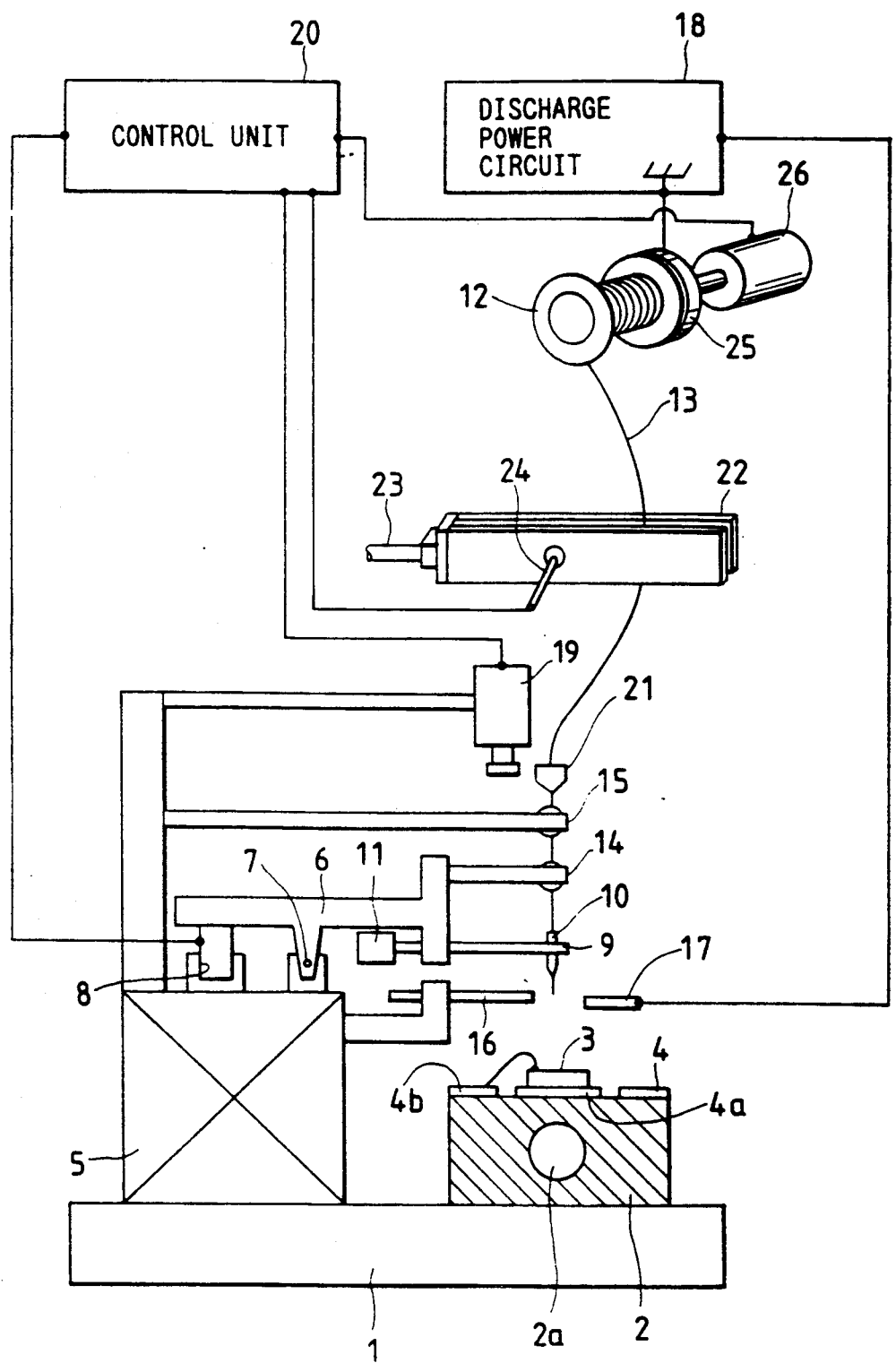
FIG. 1 is an explanatory diagram showing an apparatus for wire bonding as an embodiment of the present invention.

An apparatus for wire bonding of the present embodiment will be described with reference to FIG. 1. On bed plate 1, a bonding stage 2 is positioned with its longitudinal direction into the drawing. On the bonding stage 2, lead frame 4 is a mounting member. In the center of the lead frame 4, a tab 4a is formed and on the tab 4a there is fixed, with a conducting adhesive such as resin paste, (not illustrated), a semiconductor chip 3, which is to be heated to a predetermined temperature by means of a heater 2a provided within the bonding stage 2. Above the bed plate 1 and at a side of the bonding stage 2, an X-Y table 5 is movable on a horizontal plane. On the X-Y table 5, there is supported a bonding head 6 through pivot 7 for rotating in a vertical plane with one end positioned over the bonding stage 2. The other end of the bonding head 6 is controlled for vertical movement by means of a linear motor 8 fixed to the X-Y table 5. At the end of the bonding head 6 on the side toward the bonding stage 2, a bonding arm 9 is horizontally supported with a end located right above the bonding stage. At the capillary 10 is positioned as a bonding tool made of ruby, ceramic, or the like. The capillary 10 is fixed in place, with a wire insertion hole, (not illustrated), axially passing through the capillary in the vertical direction. Into the wire insertion hole of the capillary 10 is inserted an insulated wire 13 fed from a wire spool 12 through a wire tensioning device 22, a wire guide 21, a second clamper 15 and a first clamper 14. At the side of the base of the bonding arm 9, an ultrasonic vibrator 11 is positioned comprising a piezoelectric element or the like. The vibrator 11 when necessary is capable of applying ultrasonic vibration, for example, at 60 kHz and with amplitude of 0.5 $\mu$m-2.0 $\mu$m to the capillary 10 fixed to the front end of the bonding arm 9.

The above described bonding head 6 is arranged to be controlled by a control unit 20 including a CPU and a memory unit, (not illustrated). The control is performed, for example, in such a way that the driving voltage of the linear motor 8 is servo-controlled according to output signals of a speed detecting means and a position detecting means (not illustrated) for detecting the movement of the bonding head 6. Further, the bonding load at the time of bonding on the semiconductor chip 3 and the lead frame 4 has the driving current of the linear motor 8 controlled. Above the bonding head 6, a recognition device 19 is disposed fixed to the X-Y table 5. The recognition device 19 includes, for example, a TV camera and performs a function of detecting the bonding position on the semiconductor chip 3 and the lead frame 4. The control unit 20, in response to image information from the recognition device 19, gives instructions to the bonding head 6 to bond insulated wires 13 to detected points on the semiconductor chip 3 and detected points on the lead frame 4 thereby connecting these points with each other in succession.

The insulated wire 13 with reference for example to FIGS. 2(a)-(g) has a core wire 13a as a conductor and an insulating film 13b made of high polymer resin having an electric insulating property applied to the periphery of the core wire. As the core wire 13a, a gold (Au) wire of a diameter, for example, of 20-50 $\mu$m or, preferably, 25-32 $\mu$m is used. The insulating film 13b is made, for example, of polyurethane, polyester, polyamideimide, polyesterimide, or nylon. It should preferably be made of the above mentioned polyurethane or heat resisting polyurethane, i.e., polyurethane treated so as to exhibit heat resistance. The thickness of the insulating film may range from 0.2 $\mu$m-5.0 $\mu$m with a thickness between 0.5 $\mu$m-2.0 $\mu$m being preferred. The method for coating the wire with such an insulating film 13b is by dipping the core wire 13a in a solution of the resin material as described above diluted with a solvent to 5-20% of concentration and then drying the wire by heat. To suppress production of pin holes in the insulation by this process, it is preferred to repeat the coating and drying several times. To be more specific, the production of pin holes in the insulation was substantially reduced by repeating the coating and drying 5-15 times.

Figure 14:
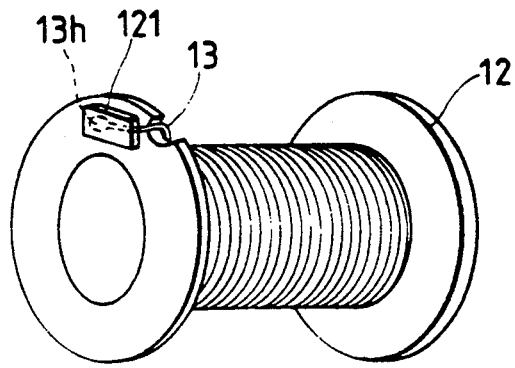
FIG. 14 is a perspective view showing a wire spool.

With reference to FIG. 14, an insulated wire 13 of a length, for example of 100-1000 m, is wound around the wire spool 12 and end 13 h is connected with a conducting portion of the wire spool 12. The wire spool 12 is electrically connected with a spool holder 25 (FIG. 1) and the spool holder 25, in turn, is connected with a discharge power circuit 18. The wire spool 12 is made of a conducting metal such as aluminum (Al) and the base end 13h of the insulated wire 13 is stripped of its insulating film. A gas burner (not illustrated) may be used to heat the insulating film 13b to thereby thermally decompose and remove it to strip the wire 13 to explore the core 13g. At this time, the base end of the core wire 13a itself may be heated to be formed into a ball. Otherwise, to improve reliability of the electrical connection a plurality of such balls may be formed along the core wire 13a. The base end where the core wire 13a has been exposed as described above is fixed to the end portion of the wire spool 12 with an adhesive tape or the like. Thus, the potential of the base end of the core wire 13a of the insulated wire 13 is kept at the same potential as that of the wire spool 12.

Figure 15:
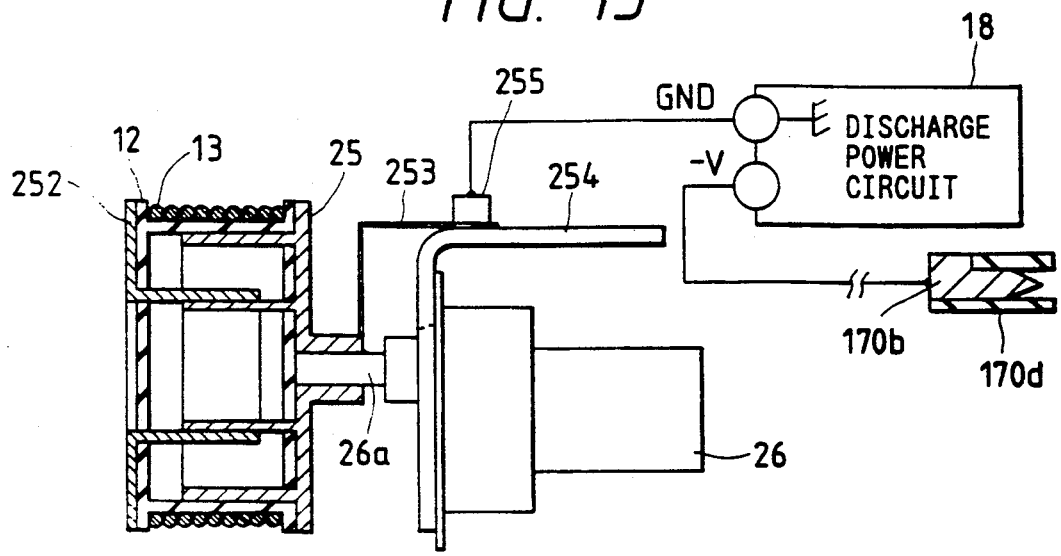
FIG. 15 is a partially sectional view of a mounting mechanism of the above wire spool.

FIG. 15 illustrates a mounting mechanism of the wire spool 12. The wire spool 12 is put in a spool holder 25 and is further fixed to the spool holder 24 by means of a spool fixing member 252 so as to be secured in place. The spool holder 25 is coupled with a cylinder 26a extended from motor 26 retained by an L-shaped retaining member 254 fixed to the bed plate 1, so that the wire spool 12 together with the spool holder 25 may be controllably rotated. An L-shaped plate spring 253 has a back end fixed to an electrode terminal 255 disposed on the retaining member 254. The front end of the plate spring 253 is arranged to urge the spool holder 25 in an axial direction opposite to the cylinder 26a. The electrode terminal 255 is connected to the ground (GND) side of the discharge power circuit 18. By virtue of spool holder 25, plate spring 253, and the electrode terminal 255, the core wire 13a of the insulated wire 13 is kept at the same potential as the potential GND of the discharge power supply circuit 18. With reference to FIG. 1 the insulated wire 13 fed from the wire spool 12 is given a predetermined tension and the tension is detected by a wire tensioning device 22.

Figure 12:
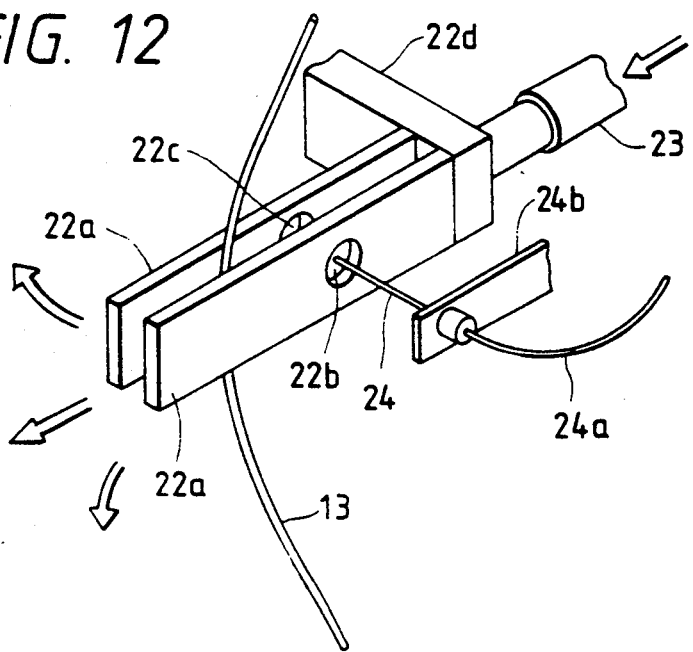
FIG. 12 is a perspective view showing a wire tensioning portion.

The structure of the wire tensioning device 22 is described below with reference to FIG. 12. The wire tensioning device 22 has a pair of air blow plates 22a, supported by a support portion 22d at a predetermined spacing. A gas is supplied from an air supplying inlet 23 which passes through the space between the confronting air blow plates at a predetermined fluid pressure. The insulated wire 13 is passed through the space between plate 22a in a direction perpendicular to the longitudinal direction of the air blow plates 22a, to cause the insulated wire 13 to be urged by the fluid pressure of the supplied gas in a direction opposite to the air supplying inlet 23 causing the insulated wire 13 to be subjected to a predetermined value of tension.

In the principal plane of the above described air blow plates 22a there is a circular detection hole 22b. In the detection hole 22b, there is inserted the front end of a reflection type optical fiber sensor 24 functioning as a light detection means.

Figure 13:
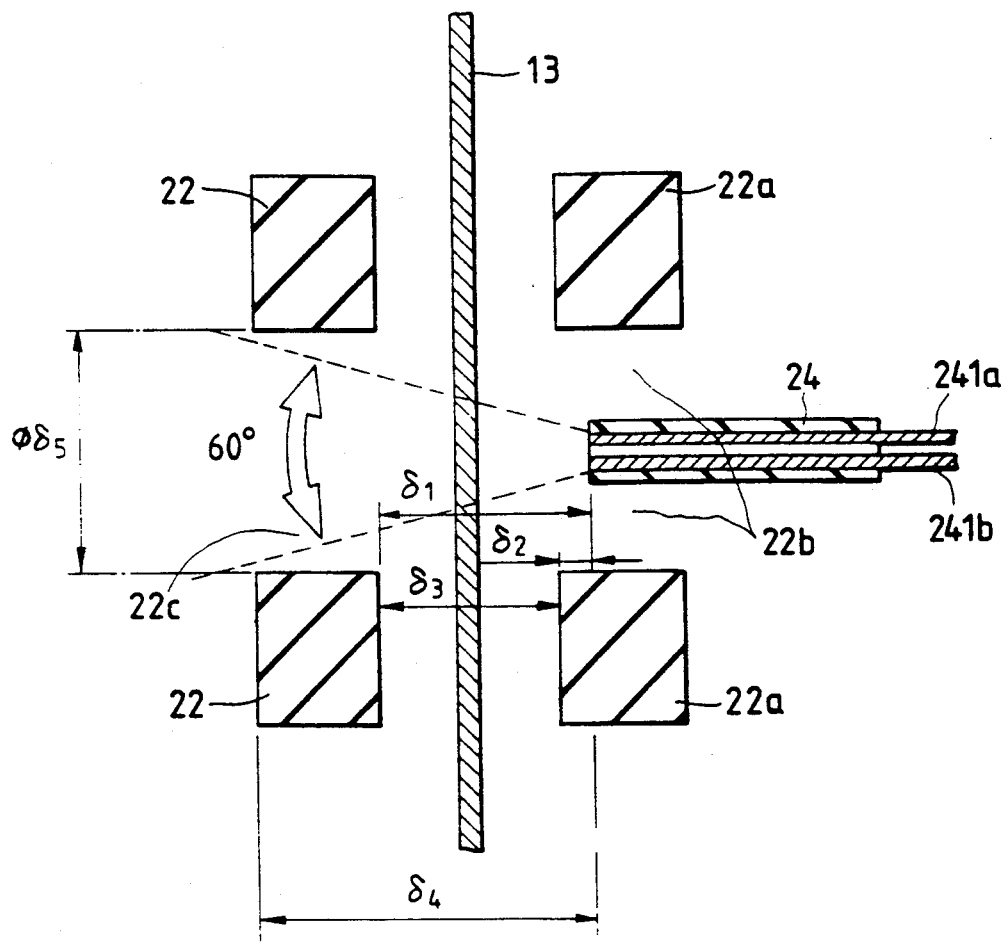
FIG. 13 is a sectional view showing a wire detection mechanism.

FIG. 13 is a sectional view illustrating the wire detection mechanism in the wire tensioning device 22 in more detail. The optical fiber sensor 24 comprises a light emitting fiber 241a and a light receiving fiber 241b. The fibers 241a and 241b are each formed in an optical fiber cable 242 of the same structure. The light emitting fiber 241a is connected with a light source such as an LED (not illustrated). The light receiving fiber 141b is connected with a photodetector device such as a phototransistor. Thus, a detecting light beam emitted from the end of the light emitting fiber 241a is reflected by the peripheral surface of the insulated wire 13 and the reflected light beam is detected by the light receiving fiber 241b.

Representing the distance from the end of the optical fiber sensor 24 to the inner face of the air blow plate 22a opposite thereto by δ1, the distance from the end of the optical fiber sensor 24 to the inner trace of the air blow plate 22a closer thereto by δ2, the distance between the opposing faces of the air blow plates 22a, by δ3, and the distance between the end of the optical fiber sensor 24 to the outer face of the air blow plate 22a opposite thereto by δ4, with δ1=0.4 mm, δ2=0.1 mm, and δ3=0.3 mm, and further, with δ5>2 δ4 tan 30°, it is possible to detect insulated wires 13 having a diameter as small as 15 δm. The above mentioned values are just for exemplification. These values can be suitably changed according to the light propagating characteristic of the optical fiber cable 24a, the diameter of the fiber, and the like. That is, they can be changed at will within tile limits enabling the detection of the insulated wire 13.

The hole 22c of the diameter δ5 provided on the opposite side of the optical fiber sensor 24 is that provided for preventing the emitted light beam by the light emitting fiber 141a from being reflected by the inner face of the air blow plate 22a on the opposite side, thereby causing the optical fiber sensor 24 to malfunction. Instead of providing the hole 22c, the inner face of the air blow plate 22a may be colored black so that the detecting light beam is absorbed thereby and no light beam is reflected therefrom. The light emitting fiber 141a and the light receiving fiber 141b may face the insulated wire 13 from different directions.

In the wire tensioning device 22 of the described arrangement of FIG. 13, the insulated wire 13 is constantly provided with a predetermined value of tension by means of fluid pressure of the supplied gas supplied between the air blow plates 22a. As the supply gas, clean air, passed through a filter or the like can be used. Preferable a flow rate is used of 5-20 liters per minute. If the flow rate is smaller than the above flow, the insulated wire 13 slackens between the first clamper 14 and the second clamper 15 of FIG. 1. As a result of slackening it becomes difficult to properly control the insulated wire 13. On the other hand, if the flow rate is higher than the above flow, the tension pulling the wire upward becomes too great, whereby not securing a suitable wire loop, making an accurate tail cut at the time of second bonding difficult, which can cause the insulated wire 13 to be broken.

In the wire tensioning device 22, the optical fiber sensor 24 always monitor the condition of the insulated wire 13 for slackening. More particularly, if the reflected beam of light from the insulated wire 13 is detected by the optical fiber sensor 24, then it is determined that it has less than a predetermined value of slackening, or that it has in a tensed condition. When the tensed condition is detected, the shaft of motor 26 coupled with the spool holder 25 is rotated a predetermined amount so that the insulated wire 13 is fed from the wire spool 12 a predetermined length. Thus, the insulated wire 13 above the wire guide 21 can be maintained in a state having a predetermined degree of slackening.

Since the tensioning of the insulated wire 13 and detection of the insulated wire 13 are performed at the same position and time by the wire tensioning device 22 integral with the air supply, the rotation of the wire spool 12 can be suitably controlled and the slackening of the insulated wire 13 can always be maintained in a predetermined condition. Thus, the tension above the capillary 10 is kept free from fluctuation, and thereby, stabilized bonding operation is assured at all times. Further, since the detection of the insulated wire 13 can be conducted in the manner not contacting the insulated wire 13 by the use of the optical fiber sensor 24, the insulated wire 13 is not damaged, and insulation and strength of the insulated wire 13 in the path of supply to the bonding stage can be prevented from being lowered. Further, by virtue of the structure of the wire tensioning device 22 being integral with the air supply as described above, providing a separate detection mechanism of the insulated wire 13 ca be eliminated and thereby simplifying of the structure of the device.

With reference to FIG. 1, the insulated wire 13 which passes through the wire guide 21 and which is aligned thereby is lowered through the second clamper 15, the first clamper 14, and passes through the capillary 10. The first clamper 14 is arranged to be fixed to the bonding head 6 and movable up and down in synchronism with the bonding arm 9. Although details of the clamping portion of the first clamper 14 are not shown, it is located right above the capillary 10 and its clamping load is controlled to be 50-150 g. The second clamper 15 is fixed to the X-Y table 5 and located right above the first clamper 14 at a height that does not interfere with the vertical movement of the first clamper 14. The second clamper 15 has a mechanism enabling it to be opened and closed independently of the first clamper 14.

Figure 11:
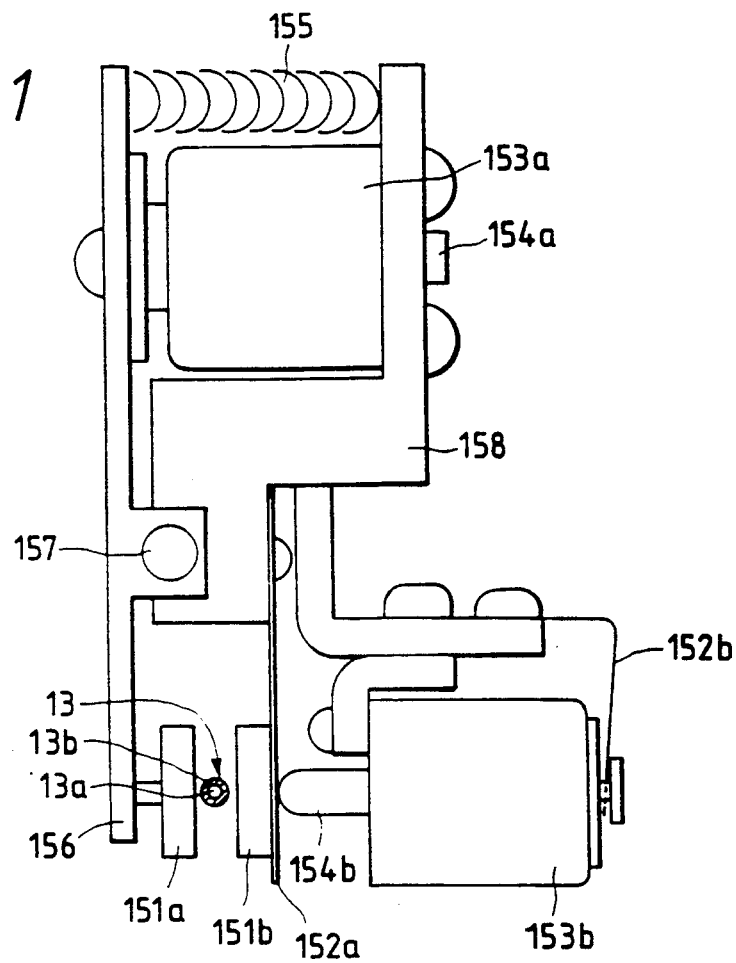
FIG. 11 is a plan view showing a clamping mechanism for a second clamper.

The clamping mechanism of tile second clamper 15 which is one of the features of the first embodiment is described with reference to FIG. 11. The second clamper 15 includes clamper chips 151a and 151b having confronting faces made of ruby or the like. The insulated wire 13 is clamped and unclamped by opening and closing operations of the clamper chips 151a and 151b. The clamper chip 151a on one side is fixed to a swing arm 156. The swing arm 156 is arranged to be rotatable around a supporting shaft 157 having rear end urged in the opening direction by means of a compression coil spring 155 attached to a supporting member 158. Between the rear end of the swing arm 156 and the supporting shaft 157, a solenoid 153a, in the off state causes the rear end of the swing arm 156 to be opened state by the expanding force of the compression coil spring 155 and the front end of the clamper chip 151a is in a closed state which clamps the insulated wire 13. Conversely, when the solenoid 153a is in the on state, a rod 154a of the solenoid 153a is moved to the left whereby the insulated wire 13 is released from the clamped state. The clamper chip 151b is attached to a plate spring 152a projecting from the supporting member 158. The clamper chip 151b is urged from its rear side to its chip face by the front end of a rod 154b of a solenoid 153b. The solenoid 153b is illustrated being in the on state, when the plate spring 152a is restricted by the rod 154b so as not to function as a plate spring. The rod 154b is provided with an L-shaped plate spring 152b having one end fixed to the supporting member 158. The rod 154b, when the solenoid 153b is in the off state, is urged to the right. Therefore, when the solenoid 153b is turned off, the plate spring 152a for retaining the clamper chip 151b is restored to its original function as plate spring.

In this way, the clamper chip 151b can exhibit two steps of clamping action The first being an urging force of the plate spring 152a and the second being by the rod 154b of the solenoid 153b. Thus, the second clamper 15 is enabled to exercise two functions, one as a fixed clamper for fixedly clamping the insulated wire 13 and the other as a frictional clamper for clamping the insulated wire 13 in a predetermined frictional state.

The control of the clamping force of the second clamper 15 is described as follows.

1. At the time when unclamped:

At this time, one solenoid 153a is put into the on state, the rod 154a is moved to the right against the compression coil spring 155, the end of the swing arm 156 is opened, and the clamper chip 151a is moved away from the insulated wire 13. Meanwhile, the solenoid 153b is in the off state and the rod 154b is moved to the right by the L-shaped plate spring 152b. Therefore, the insulated wire 13 is held free between the clamper chips 151a and 151b.

2. At the time when the first clamping load is imposed:

This is a state of so-called "frictional clamping". At this time, one solenoid 153a is put into the off state so that the compression coil spring 155 urges the rear end of the swing arm 156 to open. The clamper chip 151a at the front end of the swing arm 156 moves toward the insulated wire 13. The distance of the movement at this time is restricted by a stopper, (not illustrated). The other solenoid 153b is in the off state and the rod 154b is moved to the right by the L-shaped plate spring 152b. The clamper chip 151a is under the urging force of the compression coil spring 155, while the other clamper chip 151b is under the urging force of the plate spring 152a. At this time, by suitably adjusting the resilient force and displacement of the plate spring 152a, the clamping load on the insulated wire 13 can be set to a light load. In this case, the insulated wire 13 is not fixedly held by the second clamper 15, and is fictionally fed between the clamper chips 151a and 151b when the insulated wire 13 is given a force pulling he insulated wire 13, with a diameter is 30 μm is around 12–16 gf, the frictional force is preferably held to be lower than that, for example, around 1–4 gf. When the coefficient of friction is assumed to be approximately 0.2, the frictional force around 1–4 gf as described above corresponds to the clamping force around 5–20 gf.

By producing such a "frictional clamping" state in the later described wire bonding (refer to the description of FIG. 2(f)), the second clamper 15 can be used as a loop controlling clamper for controlling the height of a wire loop. Therefore, there is no need for providing a loop controlling clamper separately in the present apparatus. The second clamper 15 serves dual functions of pulling up the wire (at fixed clamping; refer to FIG. 2(j)) and controlling the height of a wire loop (at frictional clamping; refer to the description of FIG. 2(f)).

3. At the time when the second clamping load is imposed:

This is a state of so-called "fixed clamping". When the solenoid 153b is first put into the on state, the rod 154b is moved to the left against the urging force of the L-shaped plate spring 152b. Thereby, the plate spring 152a is restricted in its elastic deformation. Then, the solenoid 153a is put into the off state and the compression coil spring 155 urges the rear end of the swing arm 156 to open. The clamper chip 151a at the front end of the swing arm 156 is moved toward the insulated wire 13. Since the plate spring 152a for supporting the other clamper chip 151b is restricted in its elastic deformation by the rod 154b, the clamping load at this time is determined according to the urging force of the compression coil spring 155. If the clamping load resulting from the compression coil spring 155 is set to 50–150 gf and the urging load of the rod 154b by electromagnetic force of the solenoid 153b is set to 300 gf, the urging force of the compression coil spring 155 can be effectively transmitted to the insulated wire 13.

Although solenoids 153a and 153b and plate springs 152a and 152b were used as the driving mechanism of the second clamper 15 in the above description, actuators such as rotating motors and linear motors may be used instead of the solenoids 153a and 153b, and tension coil springs or the like may be used instead of the compression coil spring 15 and plate springs 152a and 152b. The clamping load by the clamper is made changeable according to the purpose and use.

The insulated wire 13 passed through the first clamper 14 and second clamper 15 is further passed through the capillary 10 such that the front end 13e (FIG. 2(a)) of the wire sticks out of the front end of the capillary 10.

Figure 8:
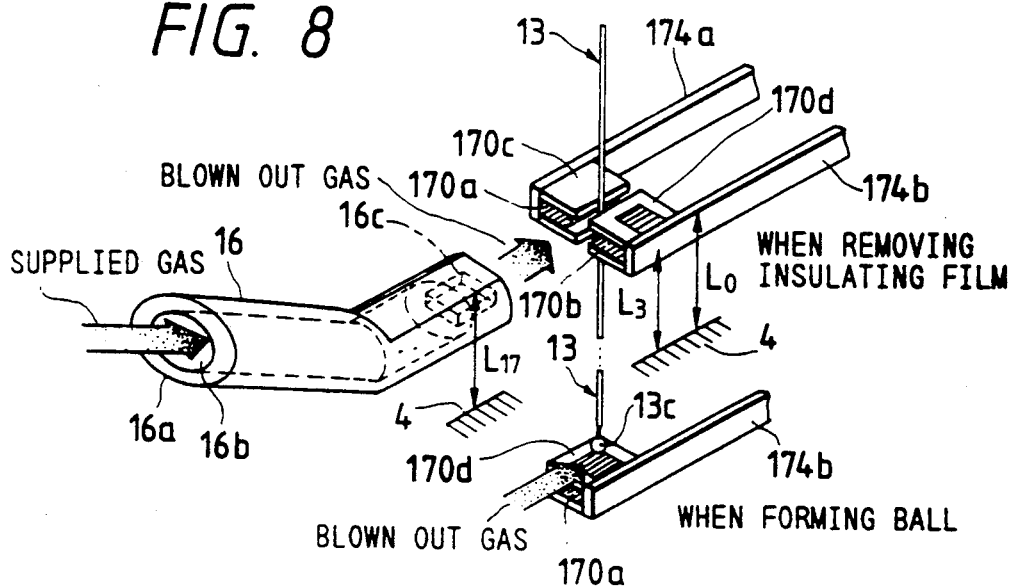
FIG. 8 is a perspective view showing relative position between an air blow nozzle and a discharging electrode.

Referring to FIG. 1, an air blow nozzle 16 and a discharging electrode 17 is positioned under the capillary 10. The air blow nozzle 16 is for blowing a gas to the electrode surface of the discharging electrode 17 as illustrated in FIG. 8 at the time of discharging to thereby prevent the electrode surface from being contaminated by the gas produced by thermal decomposition of the insulating film 13b. The air blow nozzle 16 is fixed to the X-Y table 5 an(i structured so as to be able to perform air blowing to the position set at a height ($L_0$ or $L_3$) right under the capillary 10. More particularly with reference to FIG. 8, the air blow nozzle 16 includes a nozzle tube 16a for conducting gas (air) supplied from a gas supply inlet 16b therethrough and the nozzle tube 16a has at its front end a gas blow outlet 16c having an opening with a reduced sectional area for raising the blowing pressure. The blowing height $L_{17}$ of the air blow nozzle 16 referenced from the lead frame 4 is desired to be in the middle of the heights $L_0$ and $L_3$ of the electrode surfaces of the discharging electrode 17. Therefore, such 8 height $L_{17}$ can be calculated from $$L_{17}=(L_0+L_3)/2$$

As an example, a good result was obtained by arranging the sectional area of the gas blow outlet 16c to be 0.2-1.0 mm², blowout flow to be 0.1-0.5 1/min, and the distance between the gas blow outlet 16c and the electrode surface to be 0.5-2.0 mm.

When the air flow is much higher than the above value, the discharge spark becomes unstable, and sometimes formation of the ball 13c becomes difficult or satisfactory removal of the insulating film 13b becomes unachievable. Conversely, when the blowout rate is too small, it sometimes becomes difficult to effectively prevent the electrode surface from being contaminated.

Although air was used in the above as the gas to be blown out, inert gas such as argon (Ar) and nitrogen (N2) or other gases may be used.

Figure 9:
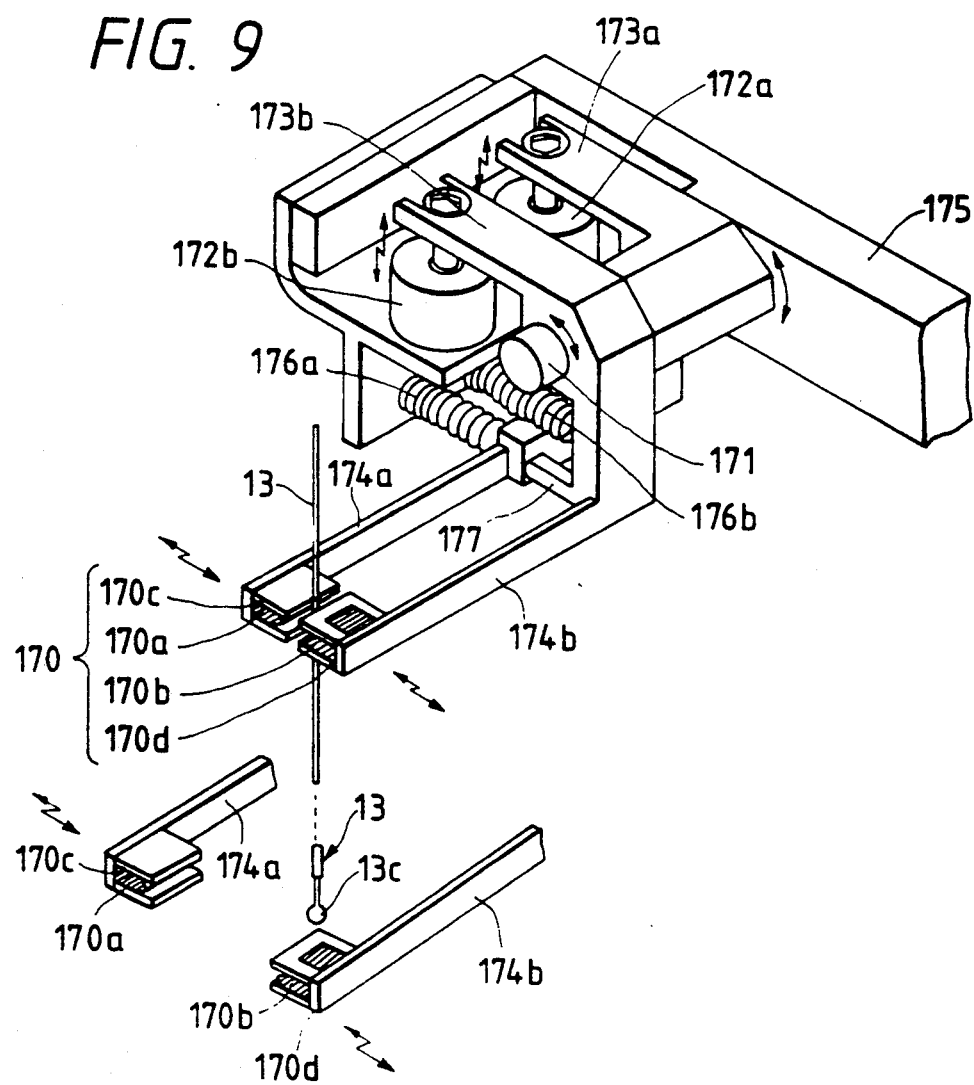
FIG. 9 is a perspective view showing a driving mechanism of a discharging electrode.

With reference to FIG. 9, structure of the discharging electrode 170 disposed opposite to the air blow nozzle 16 is described. The discharging electrode 170 has as its discharging terminals an electrode piece 170a and an electrode piece 170b. While the former electrode piece 170a is an electrode for an exclusive use to remove the insulating film the latter electrode piece 170b functions as an electrode both for removing the insulating film 13b and for forming the ball. The electrode piece 170a is structured such that it is sandwiched at its top and bottom faces in between upper and lower insulator pieces 170c made of an electric insulating material with these elements being supported by an electrode arm 174a. The electrode 170a and 170b have cross-sections such that angles facing each other are acute angle, that a concentrated discharge spark may be readily produced between each electrode piece and the core wire 13a at the time of removal of the insulating film 13b. The electrode piece 170b, the same as the electrode piece 170a, is arranged such that it is sandwiched at its top and bottom faces in between insulator pieces 170d. The upper side is constructed such that the discharging surface is exposed to the outside. The exposed portion functions as the electrode surface for ball formation. The electrode pieces 170a and 170b can be made of heat resisting electric conducting material such as tungsten (W) and the insulator pieces 170c and 170d can be formed of an insulating material such as ceramics. For fixing the electrode piece 170a, 170b with the insulator pieces 170c, 170d, a heat resisting adhesive such as ceramic bond can be used. The electrode pieces 170a and 170b and insulator pieces 170c and 170d, respectively, are connected with swing arms 173a and 173b through the electrode arms 174a and 174b for rotation around an axis of rotation 171.

The swing arm 173a is connected at its end opposite to the end where the electrode arm 174a is formed with a first solenoid 172a for discharging an electrode fixed to a supporting portion 175, and the swing arm 173b is connected with a second solenoid 172b for discharging the electrode. Both the swing arms 173a and 173b are urged upward and to the right by tension coil springs 176a and 176b. Operating mechanisms in the discharging electrode 17 will be described below.

1. When discharging operation is not performed:

At this time, the first solenoid 172a for discharging the electrode is in the off state. The electrode piece 170a is pulled under the urging force of the tension coil spring 176a locked to the swing arm 173a in the direction away from the insulated wire 13 and stopped at a predetermined position by means of a stopper (not illustrated).

The second solenoid 172b for discharging the electrode is in the on state. The electrode piece 170b is spaced away from the insulated wire 13 by the electromagnetic force of the . . . second solenoid 172b for discharging electrode imposed the swing arm 173b.

2. When a ball is formed:

At this time, the second solenoid 172b for discharging the electrode is first brought into the off state. The tension of the tension coil spring 176b is imposed oil the swing arm 173b and moves it toward the insulated wire 13. At this time, the electrode piece 170b stops at the position right under the front end (lower end) of the insulated wire 13 by means of a stopper (not illustrated). For simplicity, it is shown in FIG. 9 as if the discharging electrode 170 is moved up and down with respect to the insulated wire 13, but in reality, the height of the discharging electrode is fixed and the insulated wire 13 is vertically moved by means of the capillary 10 and the first clamper 14. It is desired, at this time, that the position of the stopper is adjusted so that the ball forming electrode surface (exposed surface) of the electrode piece 170b comes to the position best suited for performing the discharging function.

3. When insulating film is removed:

At this time, the first solenoid 172a for discharging electrode is first brought into the on state. The swing arm 173a is pulled in by electromagnetic force of the first solenoid 172a for discharging electrode 170, so that the electrode piece 170a moves toward the insulated wire 13 against the tension of the tension coil spring 176a and stops at a predetermined position. The stopping position at this time is determined by the setting of the height of the first solenoid 172a for the discharging electrode 170. In this connection, the above first solenoid 172a for discharging electrode 170 and the second solenoid 172b for discharging electrode 170 are adapted to be adjustable in height, independently. Therefore, it is possible to suitably adjust the first solenoid 172a for the discharging electrode 170 so that the electrode piece 170a stops at a position not contacting the insulated wire 13, for example, at a position a distance of approximately 100 μm in front of the insulated wire 13. Then the second solenoid 172b for discharging electrode 170 is brought into the off position. The electrode piece 170b is pulled toward the insulated wire 13 under the tension of the tension coil spring 176b. At this time, the electrode piece 170b is positioned relative to the electrode piece 170a by means of a stopper 177 provided on the swing arm 173b. More particularly, the distance between the two electrode pieces 170a and 170b depends on the projected length of the stopper 177. By suitably adjusting the stopper 177 to thereby set the distance between the two electrode pieces, for example, to 200 μm, the insulated wire 13 can be positioned between the electrode pieces 170a and 170b but not in contact with either of them.

To release the wire from the above positioned state, the above described operations may be performed in reverse sequence. It is of course necessary for properly performing the above operations that the electromagnetic force of the solenoids 172a and 172b is larger then the tension of the tension coil springs 176a and 176b. Such an effect was obtained when, for example, by setting the tension of the tension coil spring 176a, 176b to 100 gf when the electromagnetic force of the solenoid 172a, 172b in a closed state to 500 gf.

Figure 10:
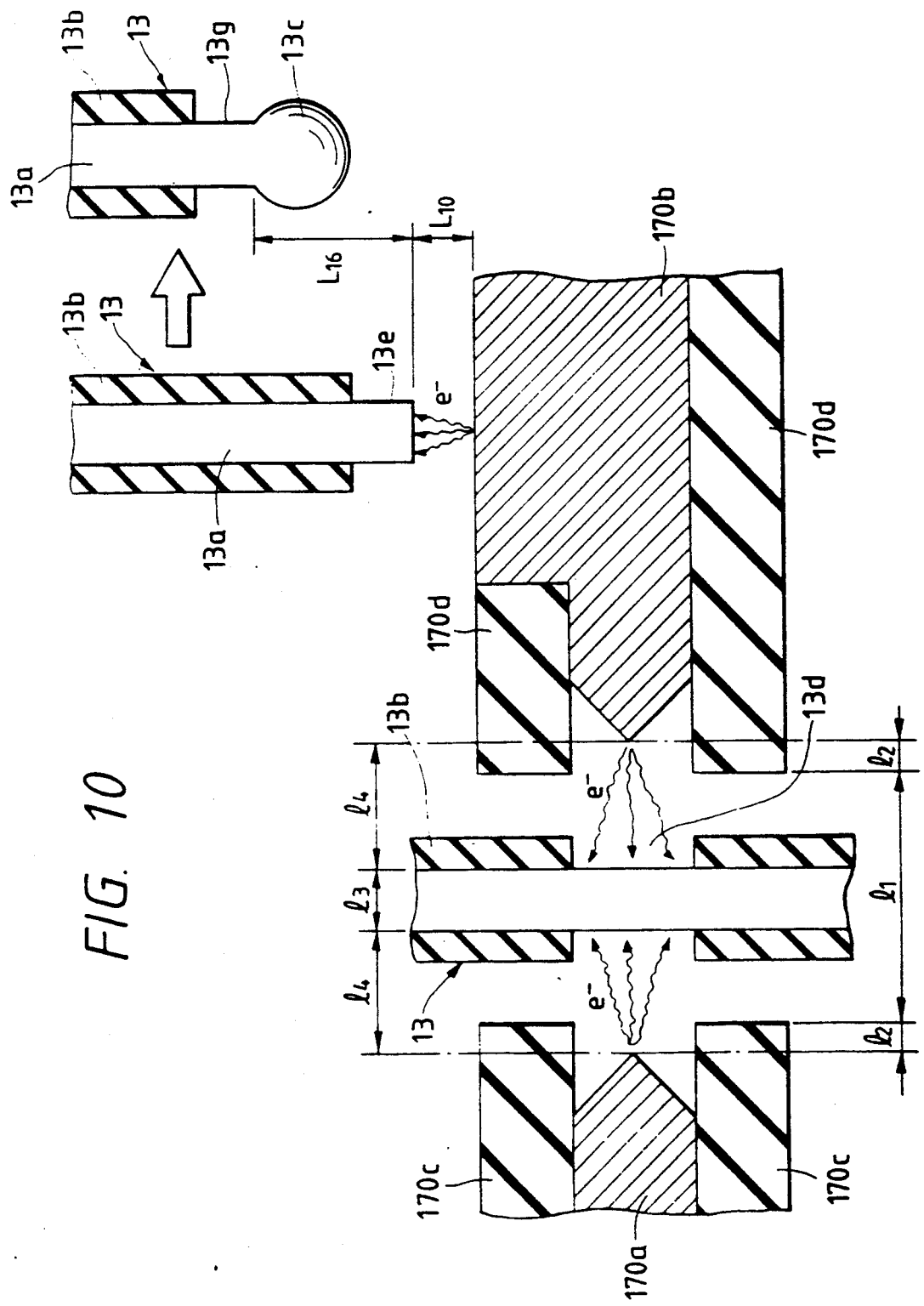
FIG. 10 is a sectional view showing relative position between a discharging electrode and an insulated wire.
Figure 19:
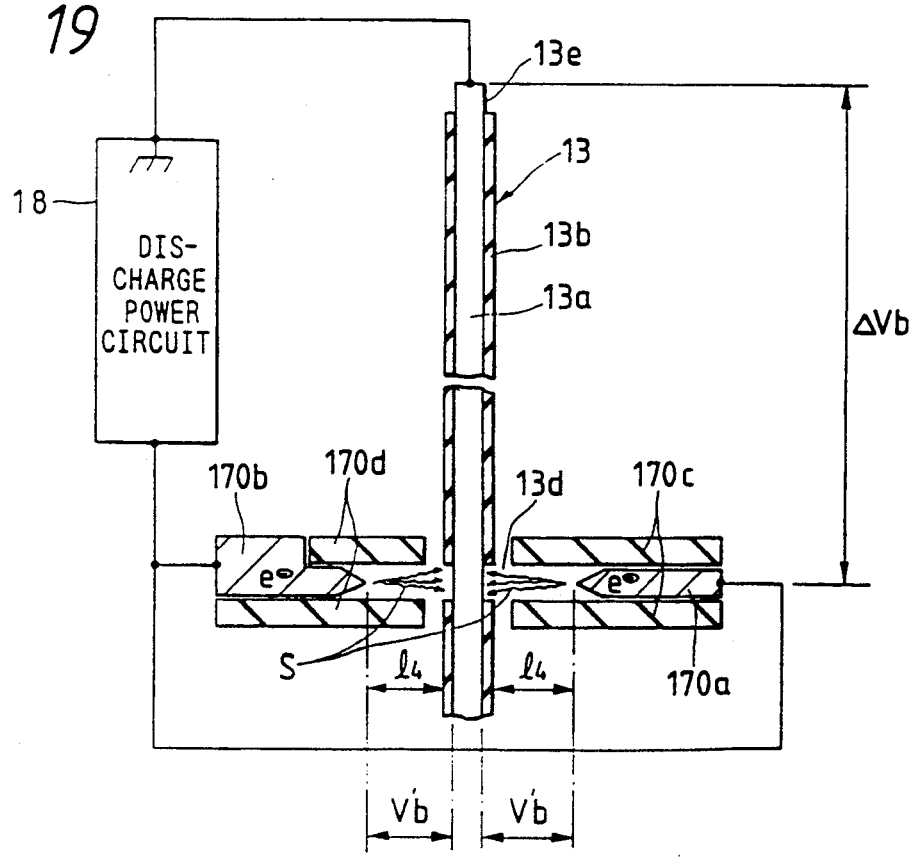
FIG. 19 is a schematic diagram for explaining discharge conditions for removing an insulating film.

With reference to FIG. 10, the insulator pieces 170c and 170d on the side of the opposing surfaces of the electrode pieces 170a and 170b are projecting a distance l2 from the opposing tip ends of the electrode pieces 170a and 170b. Representing the diameter of the core wire of the insulated wire 13 by l3 and the distance between the insulator pieces 170c and 170d by l1, the discharge gap length l4 (refer to FIG. 10 and FIG. 19) is set to satisfy $$l_2 < l_4 < l_2 + (l_1 - l_3)/2.$$

When set so that $l_2 = 200$ μm, $l_3 = 30$ μm, and $l_1 = 100$ μm, the discharge gap can be precisely set as $$200 \text{ μm} < l_4 < 235 \text{ μm},$$

and therefore, a stabilized discharging state can be attained.

Although, in FIG. 9 and FIG. 10, the insulator pieces 170c, 170d disposed around the electrode pieces 170a and 170b were shown as separated into upper and lower pieces and bonded to the electrode piece, the invention is not so limited. For example, the insulator pieces 170c and 170d can each be formed into an integrated body and each of the electrode pieces 170a and 170b can be put into the integral body so that the electrode piece 170a and 170b may not easily come off even if it is subjected to repeated impulses during the operation.

Although, with reference to FIG. 9, the invention is not limited to the first solenoid 172a for discharging electrode, the second solenoid 172b for discharging electrode, and tension coil springs 176a, 176b. Alternatively, an actuator such as a linear motor or rotating motor may be used instead of the solenoid and a spring element such as a compression spring or plate spring may be used instead of the tension coil spring.

Figure 16:
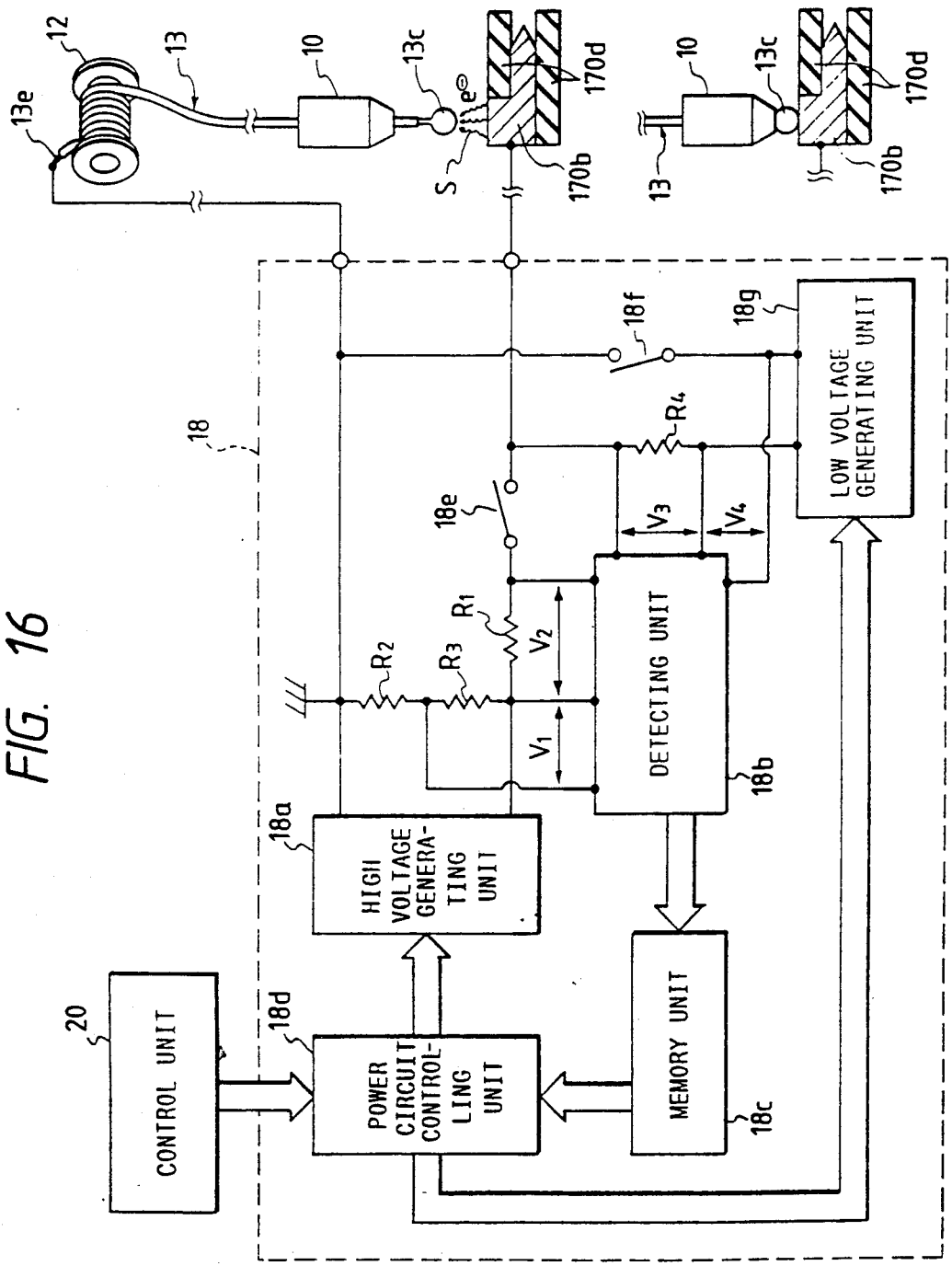
FIG. 16 is a block diagram showing a circuit configuration of a discharge power circuit.

The circuit configuration of the discharge power circuit 18 to which the electrode pieces 170a and 170b are connected is described below with reference to FIG. 16. The discharge power circuit 18 includes a power circuit controlling unit 18d, a high voltage generating unit 18a for producing a discharge spark S between the insulated wire 13 and the discharging electrode 17, a low voltage generating unit 18g for measuring the resistance of the total length of the insulated wire 13, a detecting unit 18b for detecting the wire, a memory unit 18c for storing the detected value, and resistors $R_1$-$R_4$ for measuring voltage and for measuring current connected in parallel and series. Between the high voltage generating unit 18a and the insulated wire 13 and between the low voltage generating unit 18g and the electrode piece 170b, switches 18e and 18f are respectively disposed. More particularly, a predetermined high voltage is applied between the electrode piece 170b and the core wire 13a of the insulated wire 13 when the switch 18e is closed, and a predetermined low voltage from the low voltage generating unit 18g is applied therebetween when the switch 18f is closed.

The reason for performing control of the discharge voltage by the use of the discharge power circuit 18 of the above described configuration is as described below. When an insulated wire 13 is used as in the present embodiment, differing from the case where a bare wire is used, the total length of the insulated wire 13 wound around the wire spool 12 contributes to a voltage drop ΔV in the discharge circuit. Therefore, if the wire length is neglected and a fixed voltage is applied at all times, the discharge voltage may vary making it difficult to form a stabilized ball 13c. For example, when the core wire 13a of the insulated wire 13 is made of a gold wire of 30 μm in diameter and the total length of the wire wound around the wire spool 12 is 1000 m, the total resistance value of the insulated wire 13 right after the wire spool 12 has been mounted becomes approximately 34 kΩ. As the discharging condition for forming ball 13c of approximately 75 μm in diameter at the wire end of the core wire 13a, a condition of 100 mA of discharge current and 0.5 msec of discharging time may be considered. From this, the voltage drop a ΔV in the insulated wire 13 immediately after a new wire spool has been mounted becomes as high as 3400 V.

The voltage drop V' across the discharge gap between the electrode piece 170b and the wire end 13e can be obtained from the discharge current and the discharge gap as described later. If the voltage drop is assumed to be 300 V or so, for example, the applied voltage V required for producing a discharge spark S becomes the sum of both the voltage drops, i.e., V = 3400 + 300 = 3700 V.

The value of the above described voltage drop ΔV gradually decreases as the bonding work proceeds and the insulated wire 13 is used, and finally, it becomes virtually 0 V when the insulated wire 13 wound on the wire spool 12 is used up. Therefore, if a constant voltage is applied from the beginning of use of the insulated wire 13 of a new wire spool 12 to the end, the produced ball 13c will change greatly in size.

To stabilize the formation of the ball 13c, the discharge power circuit 18 is used in the present embodiment for performing control as described below. Immediately after a ball 13c has been made, the switch 18e is opened and the switch 18f is closed so that the low voltage generating unit 18g is connected to the discharge circuit. In this state, the capillary 10 is lowered so that the ball 13c and the electrode piece 170b is shorted, and a relatively low voltage V4 is supplied from the low voltage generating unit 18g. At this time, the voltage $V_3$ across the resistor $R_4$ is measured by the detecting unit 18b. The resistance R of the total length of tile insulated wire 13 is calculated by $$R = R_4 \times [(V_4/V_3) + 1] (\Omega)$$

For example, when $V_4 = 100$ (V) and $R_4 = 100$ (Ω), and if $V_3 = 0$-$5$ (V) is measured, the resistance value of the insulated wire 13 in its total length is R 20.1 kΩ. When the optimum current in the discharge for forming a ball 13c is set to $I_{OPT} = 0.1$ A, the voltage drop ΔV in the insulated wire 13 becomes $$\Delta V = 20100 \times 0.1 = 2010 \text{ (V)}.$$

The sum total of this value and total voltage drop V' across the discharge gap becomes the set voltage VOPT at the time of ball formation, which is expressed as $$V_{OPT} = \Delta V + V'$$

The above value $V_{OPT}$ is stored in the memory unit 18c and it is used for forming a ball 13c next time. More particularly, when the next ball is to be formed, the switch 18f is opened and the switch 18e is closed and the high voltage generating unit 18a is connected to the discharge circuit. Then, upon issuance of an instruction to start a discharge from the control unit 20 to the power circuit controlling unit 18d, the power circuit controlling unit 18d reads out the value $V_{OPT}$ from the memory unit 18c and gives an instruction to the high voltage generating unit 18a to generate the voltage of that value. The electrode piece 170b and the wire end 13e are enabled to form a ball 13c in virtually the same condition as before.

The calculating method of the voltage drop V' across the discharge gap is described as follows.

Generally, the gap voltage depends on such parameters as atmosphere of discharge, atmospheric pressure, electrode material on the negative side, length of discharge gap, and discharge current, of which those to be specifically taken into consideration are the discharge gap length and the discharge current.

Figure 20:
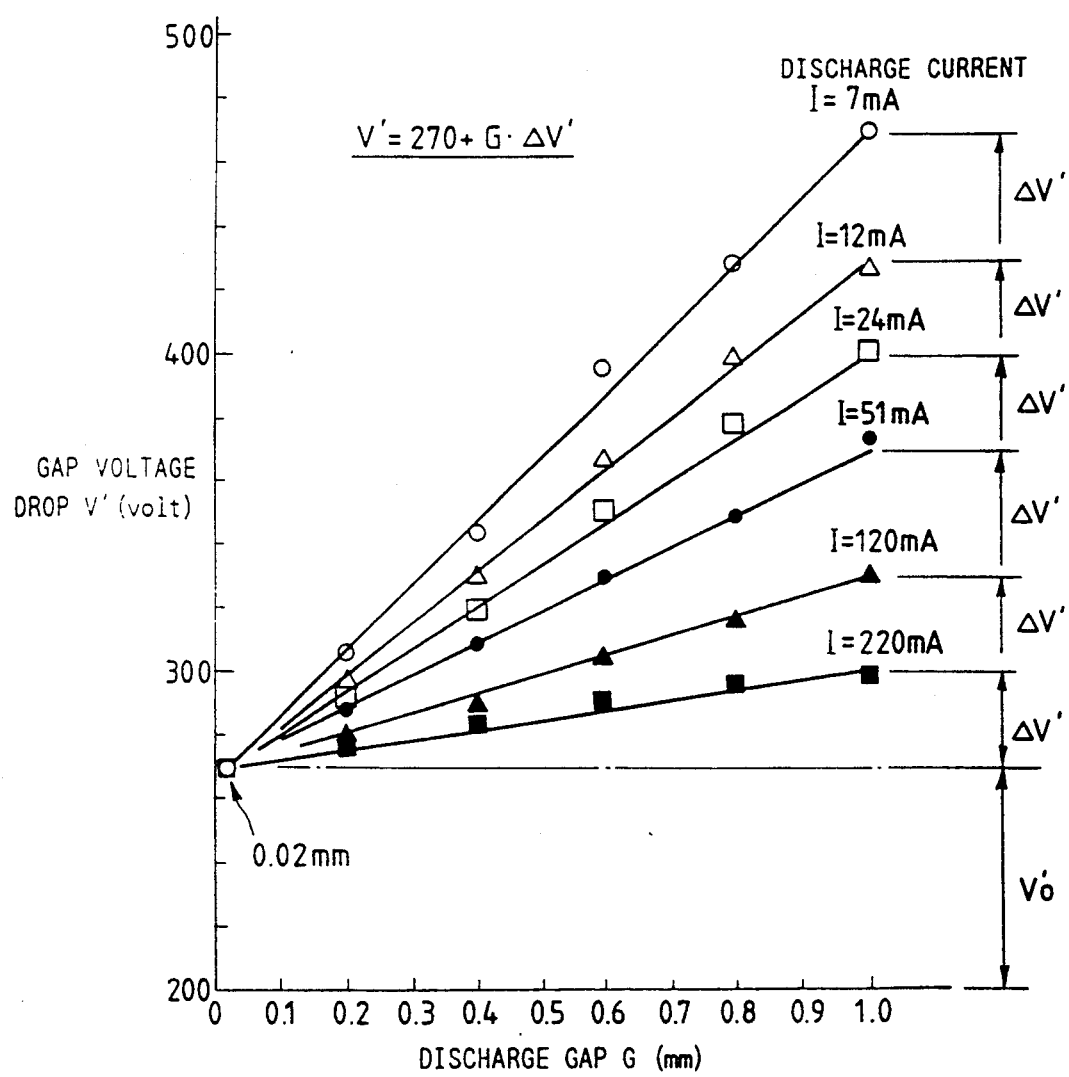
FIG. 20 is an explanatory diagram showing an example of gap voltage drops obtained from results of experiments.

In FIG. 20 is shown a graph of gap voltage drops obtained from experimental results. From FIG. 20, representing the gap voltage at the time when the discharge gap length is 0.02 mm by $V_O'$ and the variation in the gap voltage when the discharge gap length is changed to 1.0 mm by $\Delta V'$, it is known, under the condition of a constant discharge current, that the following formula holds true $$V' = 270 + G \times \Delta V' (V),$$

where G represents the discharge gap (mm).

Figure 21:
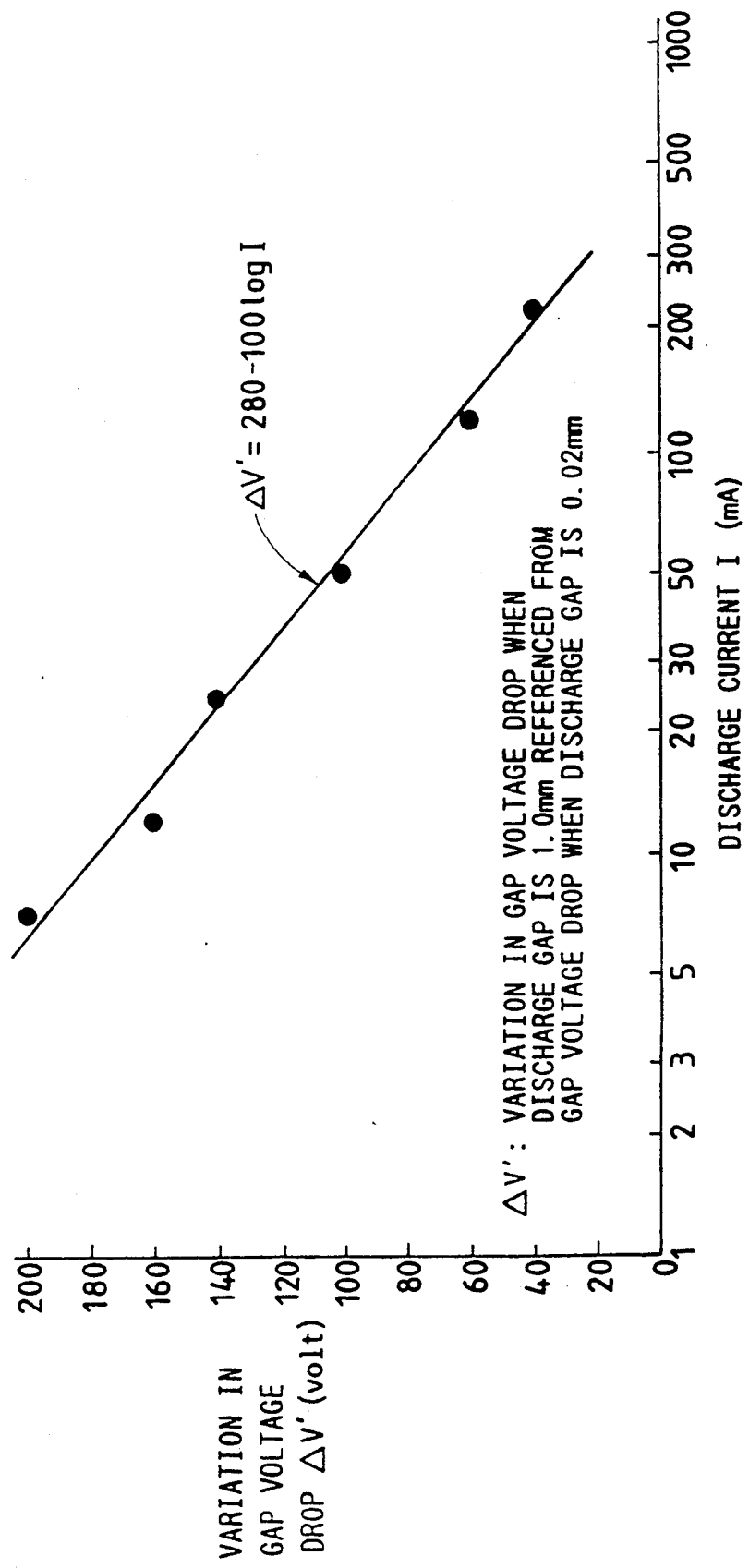
FIG. 21 is an explanatory diagram showing relationship between variation in gap voltage drop and discharge current.

According to FIG. 21, in which the discharge current I is indicated along the abscissa in a logarithmic scale a gap voltage drop $\Delta V'$ is indicated along the ordinate, the characteristic is represented by a straight line in the logarithmic plot, and the characteristic is given in a numerical expression as follows $$\Delta V' = 280 - 100 \, log_{10} I \, (V).$$

From the above two expressions, the gap voltage V' is expressed, as a function of the discharge gap length G and the discharge current I, as $$V' = 270 + G \times (280 - 100 \, log_{10} I) \, (V),$$

where each constant varies with the initial conditions in the wire bonding apparatus, such as material of the core wire 13a, material of the discharging electrode 17 (electrode piece 170b), and atmosphere of discharge. Therefore, values must be obtained by performing experiments or the like in advance.

Since the above expression is that just obtained b applying interpolation on the experimental results, its range of application is limited to a range in which the discharge current is limited within the range of I=- 7-220 mA and the discharge gap is limited within the range of G=0.02-1.0 mm.

By having the above described function stored in the memory unit 18c, even if the setting of the discharge current I in a discharge gap is changed, the suitable gap voltage V' can be calculated from the above expression at all times and the value can be used for the series of calculations of the applied voltage. It becomes possible to constantly perform stabilized discharging for forming the ball 13c and removing the insulating film 13b along the total length of the insulated wire 13.

Figure 22:
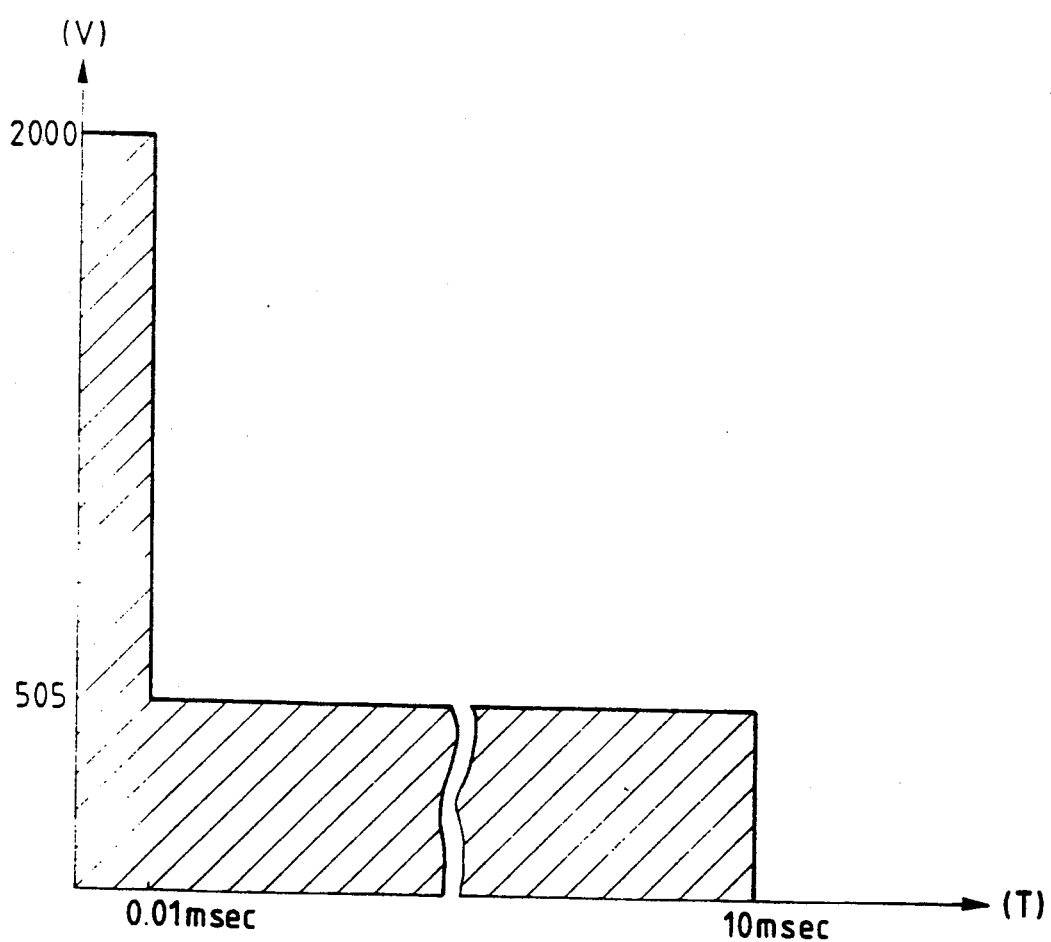
FIG. 22 is an explanatory diagram showing a state where a voltage for dielectric breakdown is applied before a discharge is produced for removing insulating film.

The way of controlling reducing the applied voltage as the insulated wire 13 becomes shorter was described above. However, if the applied voltage becomes less than 1000 V or so, it is difficult to start the discharging following dielectric breakdown. In such a case, it may be practiced, as shown in FIG. 22, to apply a voltage, 2000-4000V, for example, for causing the dielectric breakdown before the main discharge takes place for such a short period of time as 0.01-0.05 msec. In this period the energy used is negligible as compared with the total discharge energy.

A specific example of calculation of the applied voltage is described as follows with reference to FIGS. 1, 2(a) -2(j) and 16. First, the insulated wire 13 is passed through the capillary 10 and the first clamper 14 is close so that the insulated wire 13 is fixedly held with the wire end 13e sticking out approximately 1 mm from the front end of the capillary 10. At this time, the wire end 13e may have previously been heated by a gas burner or the like, not shown, to have the insulating film 13b completely removed from the wire end 13e. What is needed is that a portion of the core wire 13a is exposed at the position of the wire end 13e facing the discharging electrode surface. Then the capillary 10 is lowered and the exposed portion of the core wire 13a of the wire end 13e is brought into contact with the surface of the electrode piece 170b. At this time, by providing a short detection circuit (not illustrated), within the discharge power circuit 18, the contact condition between the wire end 13e and the electrode piece 170b may be detected so that the descent of the capillary 10 is stopped. Then, the switch 18e within the discharge power circuit 18 is opened and the switch 18f is closed in turn. In this state, a relatively low voltage is supplied from the low voltage generating unit 18g to the charge circuit including the total length of the insulated wire 13. At this time,, the applied voltage $V_4$ and a voltage $V_3$ across the resistor $R_4$ inserted in series with the circuit are measured by the detecting unit 18b. The coil resistance R of the insulated wire 13 wound around the wire spool 12 is calculated according to $$R = R_4 \times [(V_4/V_3) + 1] (\Omega)$$

Here, with $V_4 = 100$ (V) and $R_4 = 100$ ($\Omega$) and if $V_3$ is measured as $V_3 = 0.5$ (V), the result is obtained as R $= 20.1$ (k$\Omega$).

During the above described processes, measurement of the coil resistance of the insulated wire 13 at the time when the wire spool 12 has been mounted is completed. The resultant value of the coil resistance R is stored in the memory unit 18c within the discharge power circuit 18.

Figure 17:
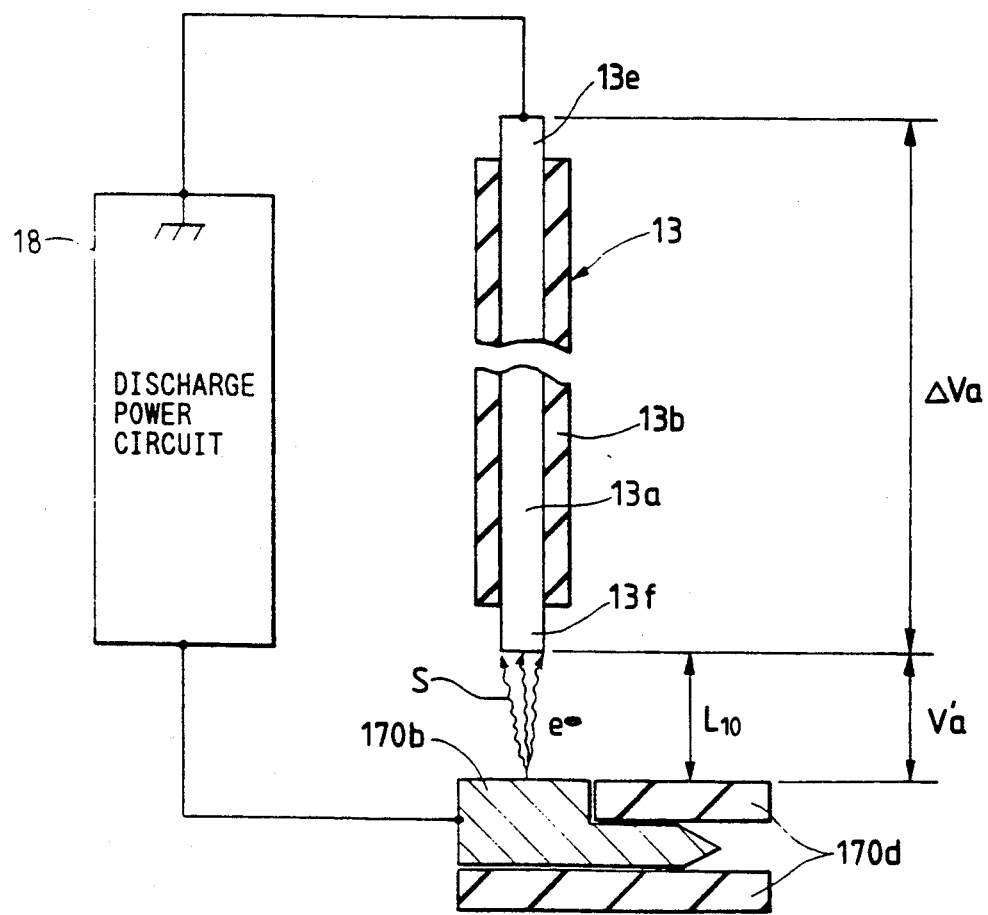
FIG. 17 and FIG. 18 are explanatory diagrams showing relationship between voltage drops across a coil portion and a discharge gap and the applied voltage.

The discharging for forming a ball as the first discharging will be described with reference to FIG. 17. As an example, when a ball 13c of 75 $\mu$m in diameter is formed at the wire end 13e of the insulated wire 13 whose core wire 13a is made of a gold wire of 30 $\mu$m in diameter, the electrode piece 170b for ball formation is set to the negative polarity, the discharging time is set to 0.5 msec, the discharge current is set to 0.1 A (100 mA), and the discharge gap is set to approximately 0.5 mm. The applied voltage to achieve the discharge current is as described above, i.e., the desired current I=0.1A, is calculated as described below. First, the coil resistance R calculated as describe above and the above set desired current I, the voltage drop $\Delta Va$ in the coil portion of the insulated wire 13 becomes $$\Delta Va = I \times R = 0.1 \times 20.1 \times 10^3 = 2010 \, (V).$$

Then, the voltage drop Va' across the discharge gap is calculated from G=0.5 mm and I=100 mA as $$Va' = 270 + G \times (280 - 100 \log_{10} I)$$
$$= 270 + 0.5 \times (280 - 100 \log_{10} 100)$$
$$= 310 \ (V).$$

The applied voltage V under the above described condition becomes $$V = \Delta Va + Va'$$
$$= 2010 + 310 = 2320 \ (V).$$

The thus obtained applied voltage V is stored in the memory unit 18c. In performing the ball forming discharging, the switch 18f is opened after the switch 18e has been closed and the high voltage generating unit 18a is activated.

Figure 18:
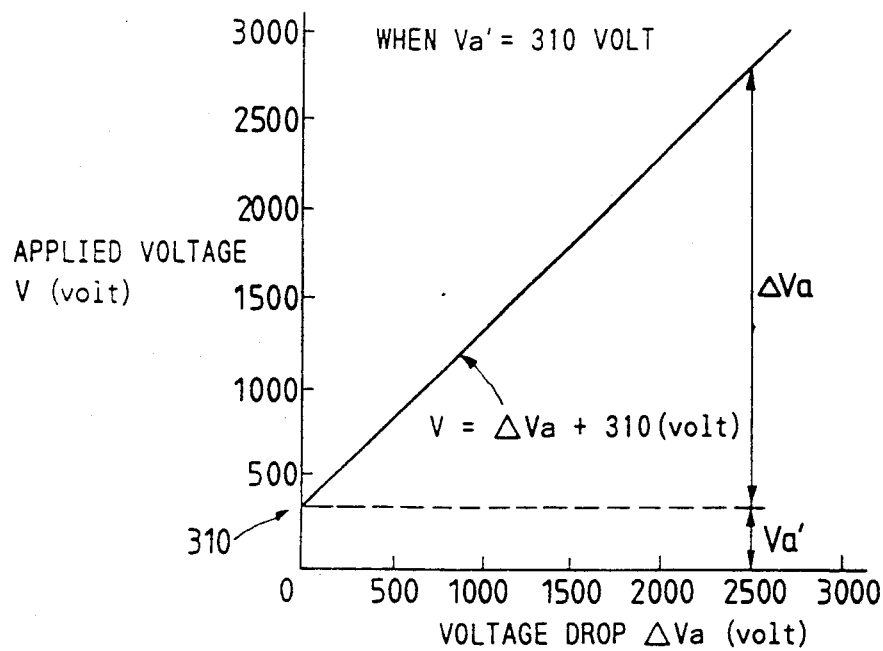

The power circuit control unit 18d reads out the above described applied voltage V (=2320 (V)) stored in the memory unit 18c and issues an instruction to the high voltage generating unit 18a to generate the voltage of the value. It is possible to supply the discharge current I=100 mA as the desired current to the electrode piece 170b as the discharging terminal for ball formation. The relationship between the applied voltage V and the voltage drop ΔVa is illustrated in FIG. 18.

The above description has been of the discharge conditions for ball formation for the first bonding. Below is described discharge conditions for removing the insulating film 13b for the second bonding with reference to FIG. 19.

Where an insulated wire 13 is formed, for example, of a core wire 13a of gold of 30 m in diameter and an insulating film 13b made of heat resisting polyurethane and coated over the core wire to a thickness of 1 μm is used and the insulating film 13b is to be removed by thermal decomposition at the portion to be bonded in the second bonding, which extends over a range of 500 μm along the length of the core wire is be described as follows. The discharge conditions are with the discharging electrode 17 set to the negative polarity, the discharge time set to 10 msec, the discharge current (desired current Ib) set to 0.01A (10 MA), and the discharge gap length set to 0.2 mm.

The applied voltage for obtaining the desired current Ib=10 mA is calculated in the following way. First, from the coil resistance value R of the insulated wire 13 calculated in the initial setting as described above and the desired current value Ib as set above, the voltage drop ΔVb in the coil portion is calculated as $$\Delta Vb = Ib \times R$$
$$= 0.01 \times 20.1 \times 10^3 = 201 \ (V).$$

Then, the voltage drop Vb' across the discharge gap (G=0.2 mm) becomes $$Vb' = 270 + G \times (280 - 100 \log_{10} I)$$
$$= 270 + 0.2 \times (280 - 100 \log_{10} 10)$$
$$= 204 \ (V).$$

From this, the desired value of the applied voltage V is obtained as $$V = \Delta Vb + Vb'$$
$$= 201 + 304$$
$$= 505 \ (V).$$

The obtained voltage value (V=505 (V)) is stored in the memory unit 18c in the discharge power circuit 18.

In actually removing the insulating film 13b by discharging, the switch 18e is closed and the high voltage generating unit 18a is rendered operative, and the applied voltage (V=505 (V)) stored in the memory unit 18c as described above is read out according to an instruction from the power circuit controlling unit 18d. Thereafter, an instruction is given to the high voltage generating unit 18a to generate the voltage of this value. In this way, it is made possible to pass the desired discharge current I=10 mA through the two electrode pieces 170a and 170b as the discharging terminals for removing the insulating film.

When the applied voltage calculated as described above is lower than 1000 V, it frequently becomes difficult to start a discharge in a stabilized manner because of too low a voltage. Therefore, as an initial voltage to start the discharge, a high voltage of, for example, 2000 V or so may be applied, as shown in FIG. 22, for such a short period of time as 0.01 msec that will not affect the entire discharge. When the applied voltage obtained by calculation is as high as above 2000 V, it is of course unnecessary to specially apply such an initial voltage.

The above described sequence of processes is performed based on the coil resistance R (R=20.1 (kΩ) in the above example) calculated immediately after a wire spool 12 has been loaded. Since the length of the insulated wire 13 gradually decreases as the bonding process is advanced, the decrease in the coil resistance R with the decrease in the total length of the insulated wire 13 must be considered in the above described calculation of the applied voltage V. The measurement of the resistance of the wire in a coil having a length gradually decreasing in the described way should be performed in the same way as in the above described initial setting More particularly, for each wire bonding process, the ball 13c formed at the wire end 13e of the insulated wire 13 is put into contact with the discharging surface of the electrode piece 170b and the switch 18e within the discharge power circuit 18 is opened and the switch 18f is closed in turn. In this state, a relatively low voltage is supplied from the low voltage generating unit 18g to the discharge circuit including the total length of the insulated wire 13. Thereupon, the applied voltage V4 and the voltage V3 across the resistor R4 connected in series with the circuit are measured in the detecting unit 18b. In this way, the coil resistance R of the insulated wire 13 wound around the wire spool 12 can be measured once for each bonding cycle in the same manner as in the above described initial setting.

Although the coil resistance R is measured once for each bonding cycle as described above, such measurement may be performed intermittently, i.e., once for each several cycles of bonding or for bonding of each unit of semiconductor chip 3, provided that the coil resistance R does not change appreciably during such an interval.

Calculation of the applied voltage V may also be performed in the following manner. It is presupposed that the initial setting has already been made and the coil resistance value R has already been determined and the bonding process is being sequentially advanced. First, it is assumed that the switch 18e in the discharge power circuit 18 is closed, the switch 18f is opened, and the high voltage generating unit 18a is operative. In this state, a discharge voltage for ball formation is supplied from the high voltage generating unit 18a so that a current is passed through the circuit. Then, a voltage $V_1$ across a resistance $R_3$ connected in parallel with the circuit for voltage detection 18b and a voltage $V_2$ across a resistor $R_1$ connected in series with the circuit for current detection are measured. The generated voltage V and the current I which flows can be calculated from these voltages $V_1$, $V_2$ as follows.

$$V = (R_2 + R_3)/R_3 \times V_1,$$

$$I = V_2/R_1.$$

If the voltage drop across the discharge gap is represented by Va', the value of the coil resistance R of the insulated wire 13 is obtained from $$R = (V - Va')/I.$$

If resistance values are set so that $R_1 = 10 \Psi R_2 = 10$ M$\Omega$, and $R_3 = 100$ k$\Omega$ and if the results of the measurements are $V_1 = 2$ (V) and $V_2 = 1$ (V), then $$\begin{aligned} V &= (10 \times 10^6 + 100 \times 10^3)/100 \times 10^3 \times 2 \\ &= 2020 \ (V), \\ I &= 1/10 = 0.1 \ (A). \end{aligned}$$

By using the value I = 0.1 A (= 100 mA) and the value of the discharge gap G (for example, G = 0.5 mm), $$\begin{aligned} Va' &= 270 + G \times (280 - 1.00 \log_{10} I) \\ &= 270 + 0.5 \times (280 - 100 \log_{10} 100) \\ &= 310 \ (V). \end{aligned}$$

From these values, the coil resistance is obtained as $$\begin{aligned} R &= (V - Va')/I \\ &= (2020 - 310)/0.1 \\ &= 17100 (\Omega) \\ &= 17.1 (k\Omega). \end{aligned}$$

The value R of the coil resistance at this time is stored in the memory unit 18c the same as before. Based on the thus obtained value of the coil resistance R, the suitable value of the applied voltage for discharging for forming a ball 13c in the next cycle can be obtained.

Although the above described measurement was that performed at the time of controlling the ball forming discharging at the first bonding position of the insulated wire 13, a similar measurement may be made at the time of control at the second bonding position, i.e., at the time of discharging for removing the insulating film. By virtue of the above described control performed in the discharge power circuit 18, it becomes possible, at any desired time, to accurately detect the change in the coil resistance with decrease in the length of the insulated wire 13 the resulting from the bonding process. Therefore, it is made possible to set up a suitable discharge voltage and formation of the ball 13c of a fixed form and removal of the insulating film 13b extending over a fixed range can be performed at all times along the total length of the insulated wire 13 to achieve stabilized bonding.

The bonding process with the above described techniques applied thereto will be described below chiefly referring to FIG. 2.

In FIG. 2(a), the first clamper 14 is in a closed state right above the semiconductor chip 3 of the bonding stage 2 with the insulated wire 13 in a clamped state and the wire end 13e of the insulated wire 13 is in a state projecting out of the front end of the capillary 10 a length La (for example, La = 0.5 mm-1.0 mm). At this time, the wire end 13e has its insulating film 13b removed 0.1-0.4 mm by means of the above described discharging technique. This process will be given later in connection with the process of FIG. 2(i).

In FIG. 2(b), the electrode piece 170b of the discharging electrode 17 (FIG. 1) is brought right under the wire end 13e of the insulated wire 13 facing the wire end 13e across a gap (discharge gap) of a predetermined length. A ball 13c is formed by virtue of the above described application of a high voltage from the discharge power circuit 18. The discharge gap at this time may be set to a length ranging from 0.2 mm to 1.0 mm or, preferably, to a length ranging from 0.3 mm to 0.7 mm. Although not illustrated, the ball 13c immediately after being formed may be put into contact with the discharging surface of the electrode piece 170b (FIG. 16) and the coil resistance R of the insulated wire 13 may be measured as described above.

In FIG. 2(c), the second chamber 15 is closed and frictionally clamped the wire, while the first clamper 14 is in an opened state. In frictional clamping 1.0 gf-4.0 gf of tension is applied to the insulated wire 13 as described above. In this state, the capillary 10 is lowered toward the first bonding position (the first position) on the semiconductor chip 3 as shown in FIG. 2(d), and then, the ball 13c is caught by the front end of the capillary 10. The entire insulated wire 13 is lowered.

FIG. 2(e) illustrates the first bonding operation. A load of 50-100 gf is imposed on the capillary 10 with the ball 13c held at the front end of the capillary 10 put in abutment with the semiconductor chip 3. In addition, ultrasonic vibration, for example, at 60 kHz and of an amplitude of 0.5 μm-1.0 μm is applied from the ultrasonic vibrator 11 to the capillary 10. The ball 13c is subjected to a multiple effect of ultrasonic vibration and heat from a heater 2a within the bonding stage 2 to heat it up to 200° C. The insulated wire 13 is bonded to the semiconductor chip 3 (bonding pad 3b) within a bonding time of 20-40 msec. Such a bond is attained by mutual diffusion of atoms of gold (Au) forming the ball 13c and aluminum (Al) forming the bonding pad 4a accelerated by the heat and ultrasonic vibration. At this time, the second clamper 15 is in an opened state (unclamped) so that the insulated wire 13 is not restricted for movement by the first clamper 14 or by the second clamper 15.

FIG. 2(f) illustrates the capillary 10 which is elevated a predetermined distance after the above described first bonding has been completed. At this time, the amount of elevation of the capillary 10 is controlled such that the front end of the capillary 10 is stopped a distance from the end of the insulated wire 13 where the insulating film 13b is to be removed (the exposed portion 13d). The capillary 10 has reached the highest position, as illustrated but this position is not limitative. It may also be arranged such that the exposed portion 13d is positioned at the front end of the capillary 10 while it is in the descending course toward the bonding position (the inner lead 4b).

From the position illustrated in FIG. 2(f), the capillary 10 may be elevated to a predetermined height and then lowered toward the second bonding position (the inner lead 4b) and the second clamper 15 may be brought into the frictionally clamp state (the state where the first clamp load is imposed) at a suitable point in the descending course of the capillary 10. Then, an upwardly pulling force acts on the insulated wire 13 against the descending capillary 10 so that occurrence of insufficient pulling of the wire is prevented and the height of the wire loop can be controlled to be stable. By bringing the second clamper 15 into the frictional clamped state while the capillary 10 descends, occurrence of an abnormal loop due to insufficient pulling in of the wire into the capillary is prevented. The necessary length of the wire to form the wire loop can be controlled to be uniform and the position of the wire to be bonded to the second bonding position (the position where the insulating film is to be removed) can be set with high accuracy.

FIG. 2(g) illustrates the capillary 10 landed on the second bonding position (the inner lead 4b) and the second bonding being performed. The movement of the capillary 10 in the horizontal direction on the drawing is provided by a relative movement of the X-Y table 5 of FIG. 1. The bonding load on the capillary 10 of 100-150 gf, bonding time of 10-30 msec, the ultrasonic frequency at 60 kHz and amplitude of 1.0-2.0 μm, and the bonding temperature at around 200° C. are preferred as bonding conditions in the above described second bonding. Under such conditions, mutual diffusion of Au atoms at the exposed portion 13d of the core wire 13a of the insulated wire 13 and Ag atoms in the silver coating on the inner lead 4b are accelerated and the bonding is thereby achieved.

In the present embodiment, since, at this time, an exposed portion 13d where the insulating film 13b is removed has been formed in advance at the second portion to be bonded of the insulation wire 13 and ultrasonic vibration is applied to the area of the peripheral surface of the core wire 13a and the inner lead 4b held in direct contact with each other, the following benefits are obtained. First, the need for application of the ultrasonic vibration for removing the insulating film 13b can be eliminated More particularly, application of multiple stages of ultrasonic vibration required for mechanically breaking and removing the insulating film 13b at the second portion to be bonded is eliminated so that bonding work can be performed effectively Second, the bonding strength in the second bonding can be maintained at a high strength. More particularly, since the insulating film 13b has already been removed and the core wire 13a is exposed when the second bonding is performed, such things as pieces of the insulating film do not get in the way at the time of application of the ultrasonic vibration. Hence, high bonding strength can be obtained and reliability on the bond can be enhanced Third, since the insulating film 13b has been removed for a suitable distance of where the second bonding is performed, bonding at low temperature can be attained, and the temperature at the time of the second bonding can be made virtually the same as in bonding a bare wire. Therefore, damage of the device due to heat, or fatigue can be prevented. Further, since the insulating film 13b is removed by discharging, the film thickness of the insulating film 13b can be made larger and hence the insulating capability of the insulated wire 13 can be maintained high.

FIG. 2(h) illustrates the capillary 10 after the completion of the second bonding elevated by a distance $L_1$ from the surface of the lead frame 4 without moving the X-Y table 5. The distance $L_1$ at this time is calculated in the later described method dependent on information on the first and second bonding positions, conditions in the initial setting of the apparatus, and so on. When the capillary 10 has been raised to the height of $L_1$, the first clamper 14 is closed and the insulated wire 13 is put into a clamped state.

FIG. 2(i) shows a state of the capillary 10 further elevated to the height of $L_2$ with the first clamper 14 closed and thereby the insulated wire 13 is clamped. At this time, the first clamper 14 with the insulated wire clamped therein ascends in association with the capillary 10 and the insulated wire 13 is broken at the position of the second bonding. As a result, the insulated wire 13 projects out of the front end of the capillary 10 by the length $L_1$.

Then, as illustrated both the electrode pieces 170a and 170b of the discharging electrode 17 surround the insulated wire 13 from two sides in a non-contact manner and a voltage controlled as described above is supplied from the discharge power circuit 18 to the discharging electrode 17. Discharges are produced between the core wire 13a and the electrode pieces 170a and 170b through the insulating film 13b. The discharge energy at this time remove a portion of the insulating film 13b at a predetermined position on the insulated wire 13. As the discharge conditions, the side of the discharging electrode 17 is given a negative polarity relative to the insulated wire 13, the discharge time is set to 2-20 msec, the discharge current is set to 5-30 mA, and the discharge gap is set to 0.1-0.5 mm. As described above, however, it is preferable to set the discharge time to 10 msec, the discharge current (the desired current Ib) to 0.01 A (10 mA), and the discharge gap length to 0.2 mm. These values, however, are not limiting. What is essential is that a suitable length of the insulating film 13b is heated to its thermally decomposed temperature, approximately 600° C., without heating the wire up to the melting point of gold (AU), 1063° C. In this connection, if the discharge conditions are set as described above, it becomes possible to thermally decompose and completely remove the insulating film 13b without forming any ball by the discharge at the portion of the insulated wire 13 on which insulation is being removed. The range of removed area of the insulating film can be controlled to be 0.1 mm 1.0 mm, or further, to be 0.4 mm–0.6 mm, steadily.

If the set height of the electrode surface of the discharging electrode 17 at this time is represented by $L_3$ and the distance from the front end of the insulated wire 13 to the center, of the removed area is represented by $L_4$, the following geometrical relationship holds between the above described heights $L_1$ and $L_2$ $$L_2 L_3 = L_1 - L_4.$$

Therefore, $$L_1 = L_2 - L_3 + L_4,$$

where, $L_2$ and $L_3$ are values to be determined by the initial setting and $L_4$ is a value to be determined by calculation based on information between positions of bonding in the next bonding operation.

After the above described discharging, the discharging electrode 17 retreats away from the lower end of the capillary 10 and the second clamper 15 is closed. At this time, the second clamper 15 is put into the fixed clamp state, where the second clamp load of 50–150 gf is set and the insulated wire 13 is completely restricted in its movement.

As illustrated in FIG. 2(j), the first clamper 14 is opened and the capillary 10 is lowered by a distance $L_8$ with respect to FIG. 2(i). Since the insulated wire 13 is restricted in its movement by the second clamper 15 at this time, the insulated wire 13 is pulled into the interior of the capillary 10 by the distance $L_8$, and hence, the front end of the insulated wire 13 is left projecting out of the front end of the capillary 10 by a length $L_g$. The first clamper 14 is closed and the second clamper 15 is opened in turn. Then the capillary 10 is elevated to the initial height $L_2$ and the X-Y table 5 makes a predetermined amount of movement and the initialization for the next bonding cycle is set up (refer to FIG. 2(a)).

Figure 3:
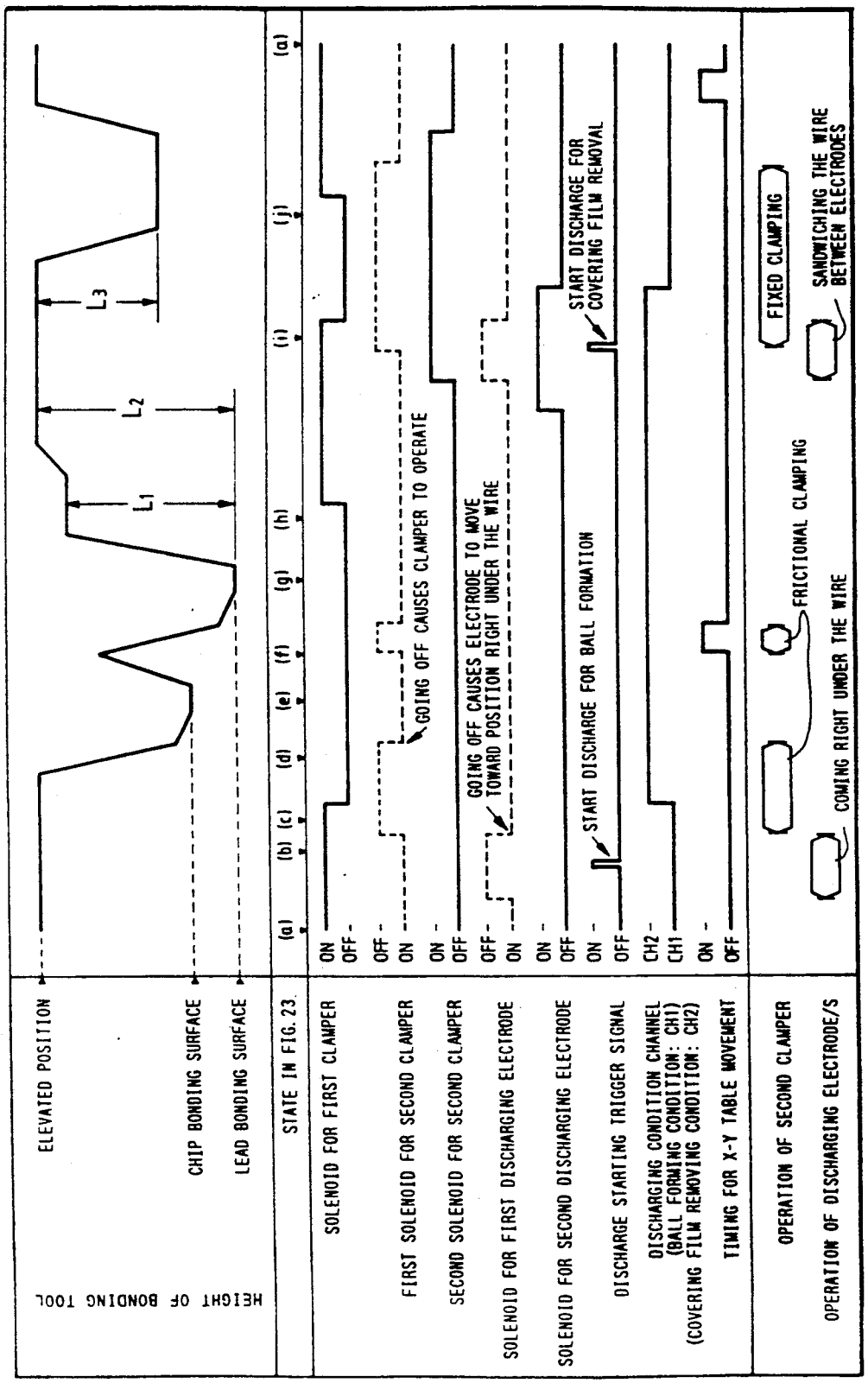
FIG. 3 is an explanatory diagram showing timing of operation in each mechanism corresponding to the above bonding process.

The above described heights of the capillary (bonding tool) 10, the operating timing of mechanisms for on/off setting of the solenoids for the first clamper 14 and second clamper 15, etc. in FIG. 2(a)–FIG. 2(j) are illustrated in FIG. 3.

Among the values $L_0$, $L_1$, $L_8$, $L_9$, and $L_{10}$ described in FIG. 2(a)–FIG. 2(j), the relationships hold as follows:

$$L_1 = L_8 + L_9,$$

$$L_2 = L_0 + L_{10} + L_9.$$

The height $L_0$ of the electrode surface of the discharging electrode 17 for forming the ball is determined in the initial setting of the apparatus. The discharge gap $L_{10}$ and the tail length $L_9$ are determined by the initial setting made by the operator. The initial height $L_2$ is logically determined from these value. At this time, the distance $L_{10}$ can be set with high accuracy, for example, by bringing the front end of the capillary 10 into contact with the discharging surface of the electrode piece 170b of the discharging electrode 17 and detecting the height by the use of a position detecting mechanism, not shown, within the bonding head 6. The height $L_3$ of the discharge electrode for removing the insulating film can also be calculated with ease.

Figure 4:
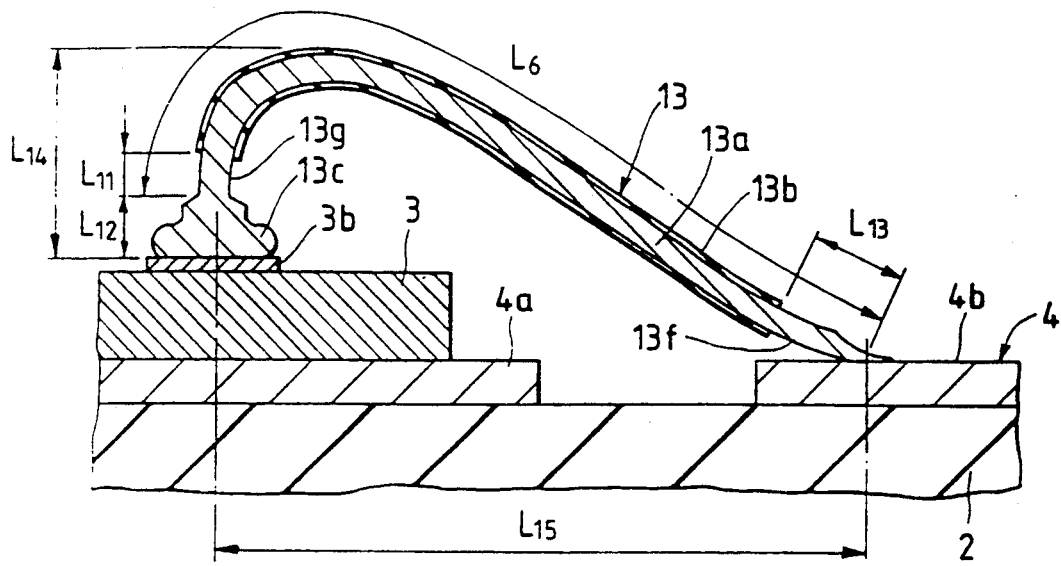
FIG. 4 is an explanatory diagram showing a semiconductor chip and its periphery finished with the bonding according to the present embodiment.

The distance $L_4$ can be calculated according to FIG. 4 from the following expression $$L_4 = L_6 + L_7$$

$L_6$ is the length of the insulated wire 13 required for the next bonding and $L_7$ is the length necessary for forming a ball 13c. The length $L_7$ is obtained based on the diameter d of the core wire 13a of the insulated wire 13 and the diameter D (μm) of the ball 13c (refer to FIG. 2(b)) from $$L_7 = (\tfrac{2}{3}) \times (D^3/d^2).$$

By setting, for example, d = 30 μm, $L_7$ becomes $$L_7 = 7.41 \times 10^{-4} \times D^3 \text{ (μm)}.$$

Figure 6:
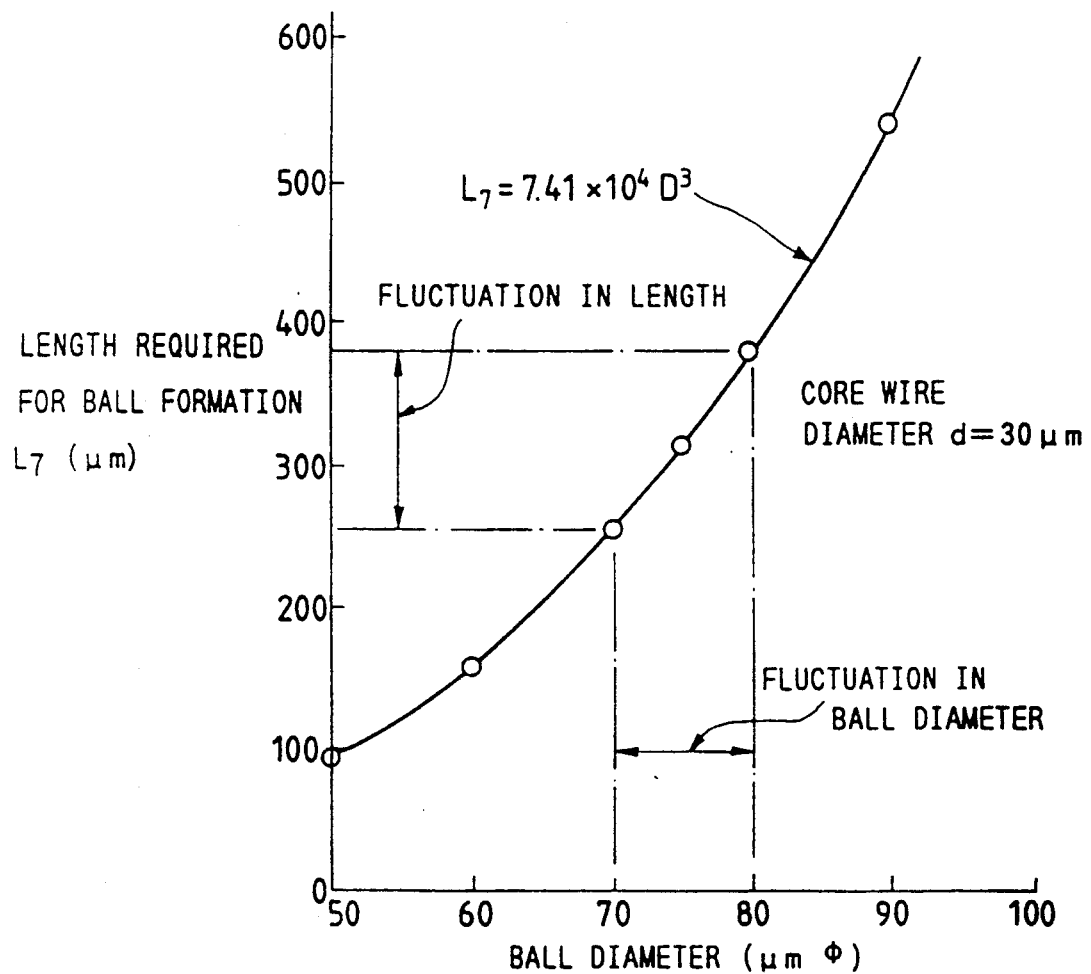
FIG. 6 is an explanatory diagram showing a relationship between a length required for ball formation and ball diameter in the first embodiment.

Assuming now that the accuracy of the diameter D of the ball 13c to be 75 μm ±5 μm, it is known that the length $L_7$ is reproduced at the accuracy on the order of 320±50 μm. The above expression is indicated as a graph in FIG. 6.

The length $L_6$ required for the bonding is obtained approximately from the wiring distance $L_{15}$ obtained upon detection of the bonding distance and the loop height $L_{14}$, i.e., $$L_6 = L_{14} + L_{15}.$$

The loop height $L_{14}$ is a value determined by wiring conditions such as mechanical property of the core wire 13a depending on its manufacturing method, the difference in level of the first and second bonding positions, the locus of the capillary 10, the amount of back tension at the time of wiring, and the discharge condition for ball formation, which is affected in particular by the wiring distance $L_{15}$. distance $L_{15}$ is experimentally obtained in advance and it is stored in the control unit 20. Therefore, a loop height $L_{14}$ corresponding to a wiring distance $L_{15}$ can be obtained.

Figure 5:
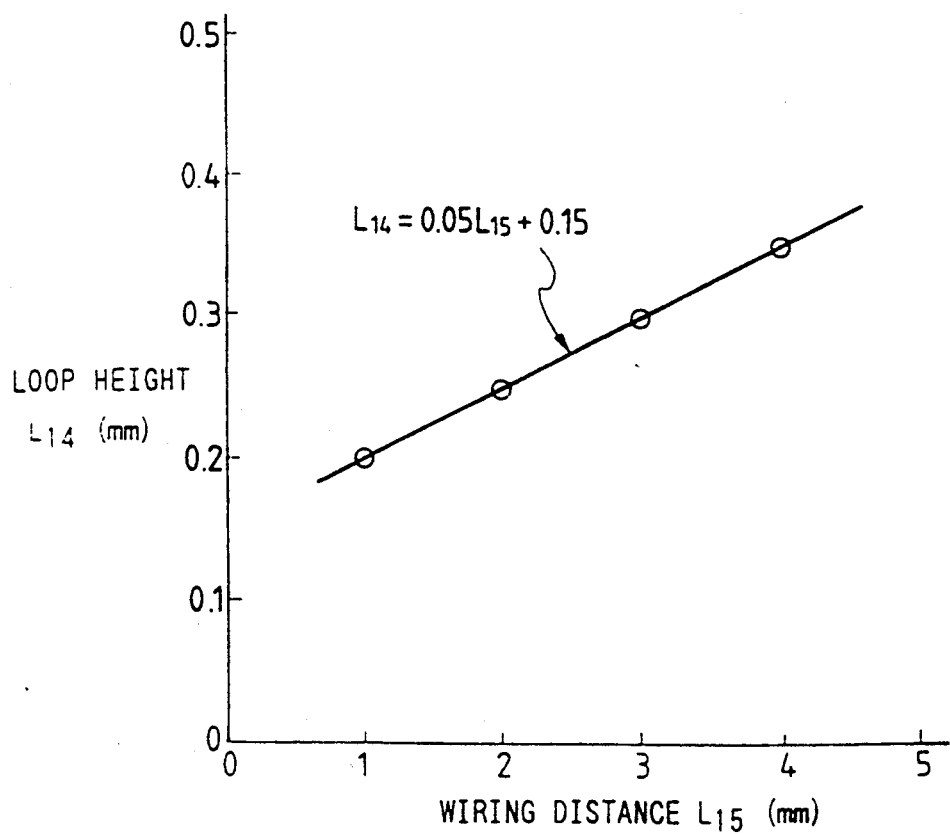
FIG. 5 is an explanatory diagram showing a relationship between a height of a wire loop and the wiring distance in the first embodiment.

As an example of experiments without limitation of the invention, an empirical relationship between the loop height $L_{14}$ and the wiring distance $L_{15}$ under a specific condition is illustrated in FIG. 5. According to FIG. 5, $L_{14}$ can be expressed as a linear function of $L_{15}$, i.e., $$L_{14} = 0.05 \times L_{15} + 0.15 \text{ (mm)}.$$

The value $L_{14}$ may of course be a function of multiple order of $L_{15}$.

By the use of the above expressions, the length $L_4$ from the front end of the insulated wire 13 to the position where the insulating film is removed (the exposed portion 13d) to be used for the next bonding can be obtained by calculation. Further, from the above values, $L_1$, $L_2$, and $L_8$ can be calculated, and by using these values, the bonding in an optimum positional relationship can be achieved.

Figure 7:
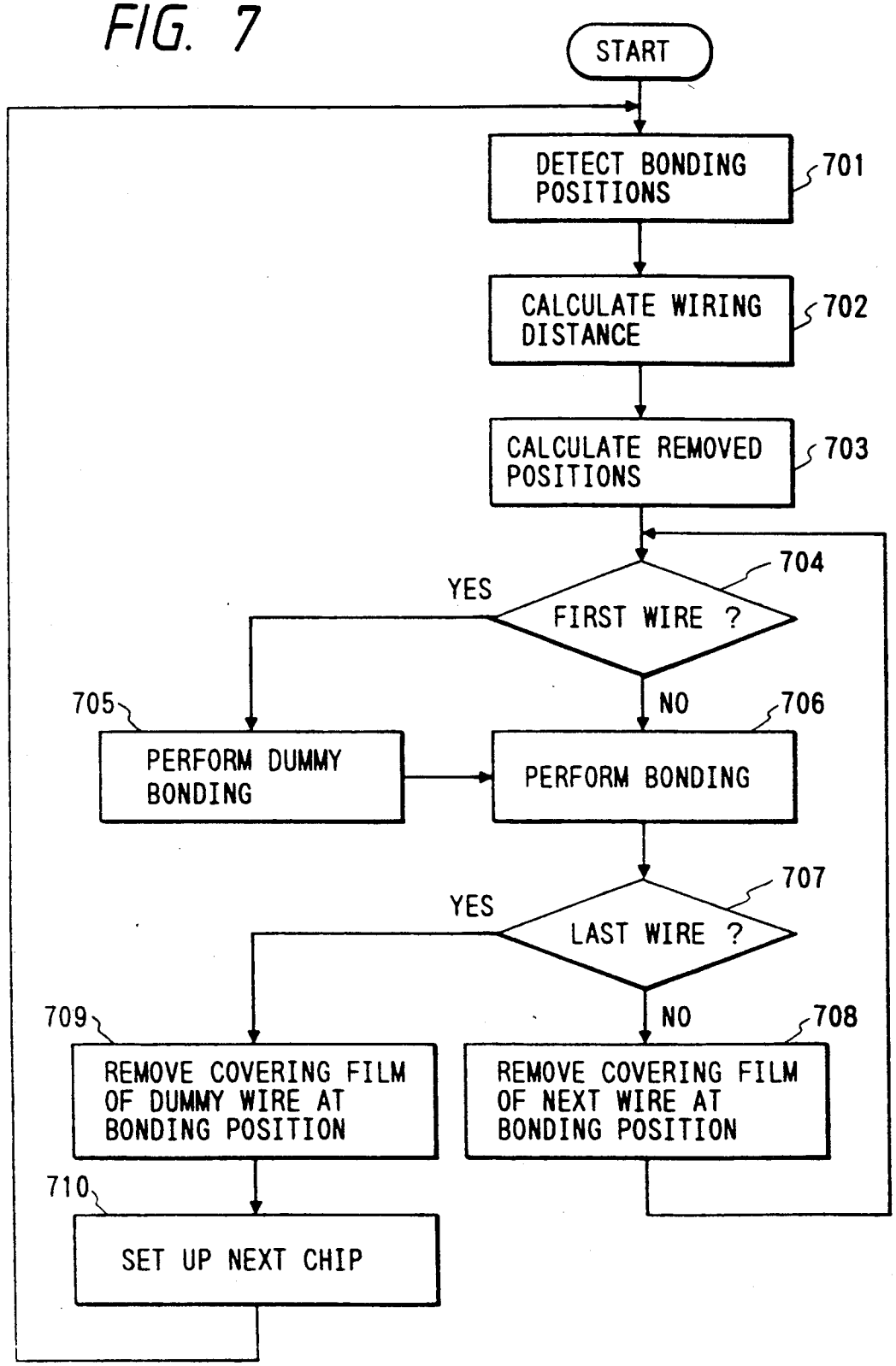
FIG. 7 is a flow chart showing a bonding process according to the first embodiment.

Although it was not mentioned above for simplicity of explanation, the following things with reference to FIG. 7 must be considered in performing sequences of bonding operations. First, bonding positions are detected (step 701) and the calculation of the wiring distance $L_{15}$ is performed (702). Based on the obtained information, the removed position $L_4$ of the insulating film 13b in each bonding cycle is calculated (703). At (704) it is determined if the first wire is being processed. Dummy bonding is performed onto the tab 4a if the answer is "yes" at (704). The wiring distance in the dummy bonding is set to a fixed value according to an instruction from the control unit 20. After the dummy bonding has been performed, the real bonding is performed (706). Thereafter, the insulating film 13b is removed at the second portion to be bonded, i.e., at the position corresponding to the value $L_4$ that has already been calculated (708). Then the processes after step 704 are repeated. If the bonded insulated wire 13 has been the last wire in the present semiconductor chip 3 (707), the next portion of the wire is subjected, as the dummy wire, to removal of the insulating film 13b at the position to be bonded at the fixed distance as indicated by the instruction from the control unit 20 (709). Subsequently, the next semiconductor chip 3 (the lead frame 4) is set up on the X-Y table 5 (710) such that the above described steps 70114 704 are repeated. Since the bonding at this time is that of the first wire for the new semiconductor chip 3, dummy bonding at step 705 is performed first and the dummy wire prepared as described above is used for the dummy bonding. At this time, since the wiring distance in the dummy wire is of a fixed length at all times, it is assured that the bonding from the following first wire can be steadily performed with an optimum wiring length. Since the bonded condition in the dummy bonding does not directly affect the reliability of the product, after the last wire has been bonded to the preceding semiconductor chip 3, it does not have to be bonded to the position corresponding to the wiring distance of the first bonding in the new chip.

Referring to FIG. 4, the exposed length $L_{13}$ of the core wire 13a at the second bonding position can be controlled to be $L_{13}=0.1-0.4$ mm by limiting, for example, fluctuation of the range of removal to 0.4–0.6 mm, fluctuation due to the calculation error of the length $L_4$ caused by fluctuation of the loop height (for the same wiring distance) to $\pm 50$ μm, and fluctuation due to the calculation error of the length $L_7$ caused by fluctuation of the ball diameter to $\pm 50$ μm. Therefore, shorting between wires or the like can be effectively prevented and highly reliable second bonding can be achieved While the invention has been described specifically, it is apparent that the present invention is not limited to that described in the above preferred embodiment but various modifications of the invention are possible without departing from the spirit and the scope of it.

Although the invention has been described in the foregoing as to the application where it is applied to preferred field of utilization, i.e., the wire bonding technique with an insulated wire using a gold wire as the core wire, the applications of the invention are not limited thereto. For example, the invention can also be applied to the wire bonding process with an insulated wire using other conducting metals such as a copper wire or an aluminum wire as the core wire.

Benefits obtained from representative aspects of the invention described in its preferred form are briefly described as follows. Formation of a ball and exposure of the core wire at the first portion to be bonded and the second portion to be bonded of an insulated wire can be achieved without making the structure of the apparatus complex and wire bonding using an insulated wire and providing high bonding strength can be performed. The wire can be constantly kept in a fixed degree of slackening without fluctuation in the tension of the wire above the bonding tool. Therefore, a constantly stabilized bonding operation can be performed.

Since an optimum applied voltage adjusted for decrease in length of the insulated wire can be constantly supplied, formation of a ball of a stabilized size and removal of the insulating film in a stabilized length can be achieved. Highly reliable and stabilized wire bonding can be performed irrespective of the length of the wire wound around the wire spool. Since the wire loop can be controlled to a steady height, bonding of the portion of the wire where the insulating film is removed to the object can be performed with high accuracy. Stabilized bonding with optimum wiring length can be performed from the first wire for each semiconductor chip at all times. It is possible to improve reliability of wire bonding of the semiconductor devices fabricated through the wire bonding process having benefits as described above.

EMBODIMENT 2

Figure 24:
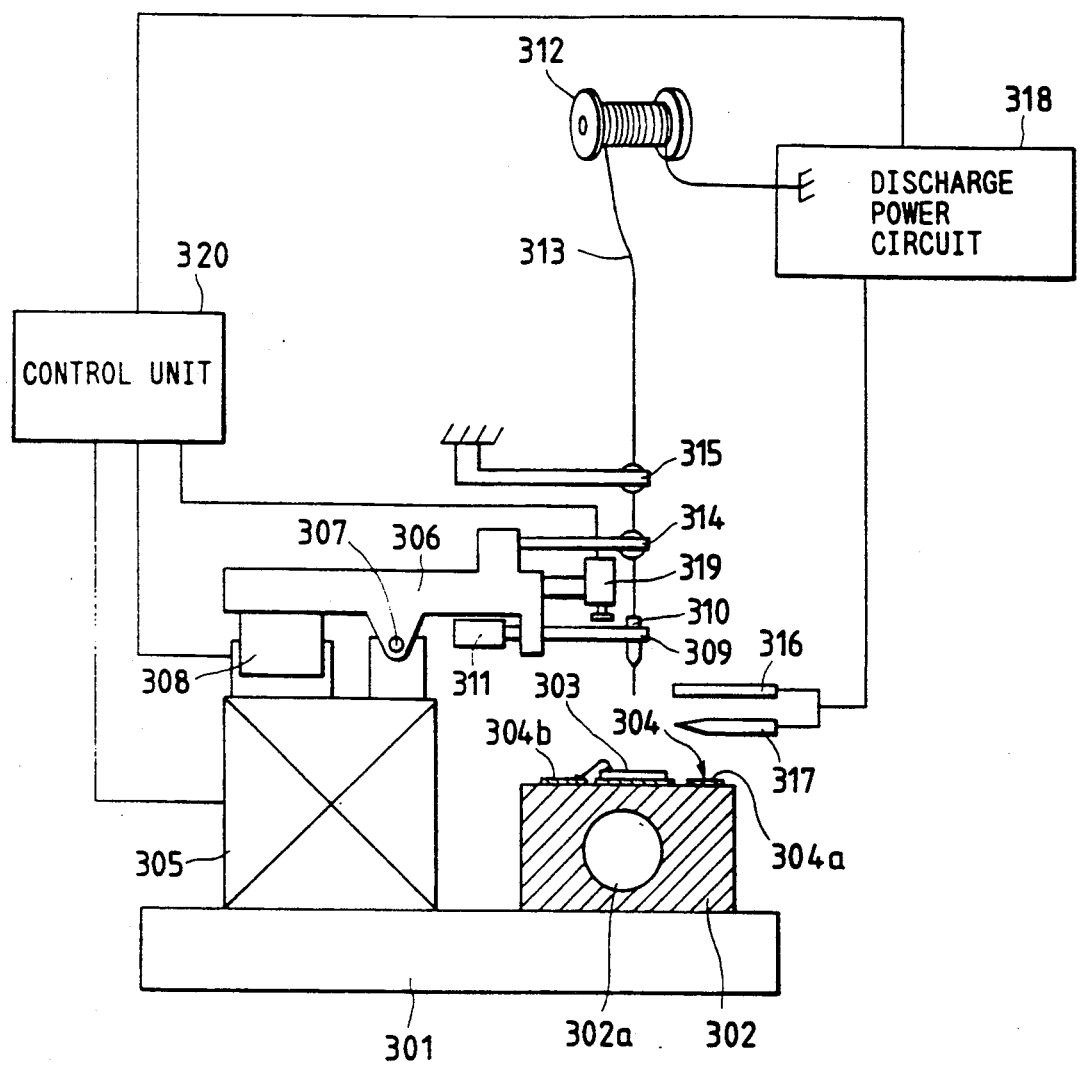
FIG. 24 is a side view schematically showing an arrangement of another embodiment of an apparatus for wire bonding of the present invention.

FIG. 23(a)–FIG. 23(j) are process drawings showing an example of operations in an embodiment of a method for wire bonding of the present invention and FIG. 24 is a side view schematically illustrating structure of an embodiment of an apparatus for wire bonding of the present invention. Referring first to FIG. 24, the wire bonding apparatus is described. On a bed plate 301, a bonding stage 302 is arranged such that its longitudinal direction is in the direction perpendicular to the page. On the bonding stage 302, there is mounted a lead frame 304, which comprises a train of a plurality of tabs 304a disposed in the center of the lead frame 304 in the direction perpendicular to the page at a predetermined pitch. Each tab 304a has a semiconductor chip 303 mounted thereon and a plurality of leads 304b surrounding the semiconductor chip 303 mounted on individual tabs 304a. The bonding stage 302 incorporates a heater 302a, used for heating the lead frame 304 mounted thereon together with the semiconductor chips 303 to a predetermined temperature. Above the bed plate 301 and at a side of the bonding stage 302, there is arranged an X-Y table 305 movable on a horizontal plane. On the X-Y table 305, there is supported a bonding head 306 by a shaft 307 for swinging in a vertical plane, with one end positioned above the bonding stage 302. The other end of the bonding head 306 is connected with a linear motor 308 mounted on the X-Y table 305 for producing vertical movement. On the end of the bonding head 306 at the side above the bonding stage 302, there is supported horizontally a bonding arm 309. At its front end located directly above the bonding stage 302, there is fixedly held a capillary 310 with a wire insertion hole (not illustrated) axially passing therethrough held in the vertical direction. At the side of the base of the bonding arm 309, there is provided an ultrasonic vibrator 311, for applying predetermined ultrasonic vibration to the capillary 310 fixed to the front end of the bonding arm 309 at any time. Into the wire insertion hole of the capillary is inserted an insulated wire 313 fed from a reel 312. The insulated wire 313 is formed of a core wire 313a made of a conductive metallic material (for example, Au) of, for example, 25–30 μm in diameter and a insulating film 313b made of a high polymer resin material having an insulating property (for example, polyurethane or heat resisting polyurethane) of 1−2 μm in thickness covering the core wire. In the path of the insulated wire 313 between the capillary 310 and the reel 312, there is provided, fixed to the bonding head 306, a first wire clamper 314, which when necessary prevents the insulated wire 313 from being delivered from the capillary 310 by restricting the insulated wire 313 in its movement, and which provides vertical movement together with the capillary 310 by swinging movement of the bonding head 306 by means of the linear motor 308. In the path of the insulated wire 313 between the capillary 310 and the reel 312, there is further provided a second wire clamper 315 fixed to the side of the bed plate 301 independently of the bonding head 306, and the second wire clamper 315 operates independently of the first wire clamper 314 and prevents the insulated wire 313 from being delivered from the capillary 313 when necessary. Further, in the path of the insulated wire 313 between the capillary 310 and the reel 312, there is provided a back tension mechanism, which constantly applies a predetermined value of tension pulling back the insulated wire 313 in the direction from the capillary 310 to the reel 312 by blowing an air stream at a predetermined flow velocity to the insulated wire 313 at its periphery. The insulated wire 313 moves in the direction to return to the reel 312 when both the first wire clamper 314 and the second wire clamper 315 are opened. In the vicinity of the capillary 310 fixed at the front end of the bonding arm 309, there is provided a first discharging electrode 316 positioned at a predetermined height from the bonding stage 302 for horizontal movement in the direction to come right under the front end of the capillary 310. A predetermined value of discharge voltage from a discharge power circuit 318 is applied between the same and the insulated wire 318 is applied between the same and the insulated wire 313 at predetermined timing. The first discharging electrode 316 moves when necessary to the position directly under the front end of the insulated wire 313 projecting out of the front end of the capillary 310 a predetermined length in such a way that there is left a predetermined gap between the capillary and the front end of the insulated wire 313. A discharge is produced between the first discharging electrode 316 and the front end of the insulated wire 313 to melt the core wire 313a of the insulated wire 313 to form a ball 313c by virtue of surface tension. In the vicinity of the first discharging electrode 316 producing the discharge for forming the ball 313c at the front end of the insulated wire 313, there is disposed a second discharging electrode 317 for movement in the direction crossing the path of the insulated wire 313 drawn out of the front end of the capillary 310 and connected with the discharge power source 318. The second discharging electrode 317 faces the insulated wire 313 drawn out of the capillary 310 from both its sides with a desired gap therebetween. Then, discharges are produced between the electrode and the core wire 313a through the insulating film 313b so that the insulating film 313b covering the core wire 313a is vaporized (thermally decomposed) and removed by energy of the discharge a predetermined length in the longitudinal direction. The process for forming an exposed portion 313d, where the core wire 313a is exposed to the outside at a predetermined distance from the end of the insulated wire 313 is performed. The bonding head 306 is provided with an image recognition mechanism 319 for picking up images of the semiconductor chip 303 located right under the capillary 310 and the lead frame 304 having the semiconductor chip 303 mounted thereon to recognize the position of a plurality of later described bonding heads 303a provided on the semiconductor chip 303, a plurality of leads 304b surrounding the semiconductor pellet 303, etc. The X-Y table 305 on which the image recognition mechanism 319 and the bonding head 306 are mounted, the linear motor 308 for controlling the vertical movement of the bonding head 306, the first wire clamper 314, the second wire clamper 315, the discharge power circuit 318, etc. are controlled by the control unit 320 so that later described bonding operations are performed through their associated operations.

An example of a wire bonding method in which the wire bonding apparatus of the above described structure is employed is described below with reference to FIG. 23(a) to FIG. 23(j). First, the lead frame 304 is moved in the direction perpendicular to FIG. 24 by a feed mechanism provided on the bonding stage 302. A semiconductor chip 303 mounted thereon is positioned directly under the bonding head 306 and at the same time, the lead frame is heated up to the temperature of about 200° C. by the heater 302a. A control unit 320 recognizes the distance between the bonding pad 303a of the semiconductor chip 303 being bonded and the bonding position of the corresponding lead 304b by means of the image recognition mechanism 319. At this time, the first wire clamper 314 and the second wire clamper 315 on the side of the bonding head 306 are both opened and the ball 313a formed at the front end of the insulated wire 313 is held by the front end of the capillary 310 by virtue of the tension produced by the back tension mechanism (FIG. 23(a)). The X-Y table 5 is suitably moved so that the capillary 310 is positioned right above the aimed one of the plural bonding pads 303a on the semiconductor pellet 303. At the same time, the linear motor 308 is operated so that the capillary 310 is lowered onto the target bonding pad 303a. Ultrasonic vibration at approximately 60 kHz from the ultrasonic vibrator 311 is applied to the capillary 310 while it presses the ball 313c against the bonding pad 303a with a load of 50-150 gf. The ball 313c is compression-bonded to the bonding pad 303a (FIG. 23(b)). Then, the linear motor 308 is operated to thereby elevate the capillary 310. The capillary 310 delivers the insulated wire 313 while it ascends and brings its front end to the same height as the position of the exposed portion 313d of the core wire 313a previously formed at a certain distance from the end of the insulated wire 313 in the manner as later described (FIG. 23(c)). Further, the X-Y table 305 is driven so that the capillary 310 is positioned right above one of the plural leads 304b. At the same time, the linear motor 308 is driven and the capillary 310 is lowered. The portion of the peripheral surface of the core wire 313a exposed to the outside at the exposed portion 313d of the insulated wire 313 is brought into direct contact with the surface of the lead 304b and pressed against the surface. Ultrasonic vibration is applied to the wire so that the peripheral portion of the core wire 313a is thermal—compression-bonded to the surface of the lead 304b (FIG. 23(d)). Since, the bonding is performed with the core wire 313a and the lead 304b held in direct contact without the insulating film 313b interposed therebetween, the insulating film 313b or foreign materials produced from the insulating film 313b thermally changed in quality do not come between the core wire 313a and the lead 304b or between the core wire 313a and the capillary 310. Compared with the bonding in the prior art performed through the insulating film 313b, larger bonding strength and lower electric resistance are obtained at the bonded portion, and thus, a good bonding characteristic is obtained at the bonded portion between the peripheral surface of the core wire 313a of the insulated wire 313 and the lead 304b. Further, trouble consequent from foreign materials coming into the wire insertion hole does not occur and the operations for delivering and pulling in the insulated wire 313 are smoothly performed at all times. Stabilized bonding work can be continued over a long period of time. The capillary 310 ascends a distance $L_1$ predetermined by calculation from the surface of the lead 304b and stops (FIG. 23(e)). During the course from FIG. 23(a) to FIG. 23(e), the first wire clamper 314 and the second wire clamper 315 remains open. The first wire clamper 314 is closed and with the insulated wire 313 clamped the capillary 310 further ascends from the height $L_1$ to the height of $L_2$ and stops. At this time, the insulated wire 313 is broken in the vicinity of the bonded position on the lead 304b. The electric connection by wiring the insulated wire 313 between one bonding pad 303a on the semiconductor chip 303 and one corresponding lead 304b of the lead frame 304 is completed (FIG. 23(f)).

Then, the second discharging electrode 317 located at a predetermined height $L_3$ from the surface of the lead 304b approaches the corresponding portion of the insulated wire 313, which is pulled out of the front end of the capillary 310, from both its sides and produces discharges between the electrode and the core wire 313a through the insulating film 313b (FIG. 23(g)). The energy of the discharge provided at this time, completely removes the insulating film 313b at the desired distance $L_4$ from the end of the insulated wire 313 is completely removed by thermal decomposition and the like extending over a predetermined length $L_5$ in the axial direction. The exposed portion 313d where the core wire 313a is exposed to the outside is formed. As discharging conditions at this time, it is preferred to make the polarity of the second discharging electrode 317 negative relative to the core wire 313a and set the dielectric breakdown voltage of the insulating film 313b and the gap to 2000-4000 V, the discharge current to 10-20 mA, the discharging period of time to 2-10 msec, and the discharge gap to 0.10.3 mm. Under such conditions, the insulating film 313b can be steadily removed extending over a range of 0.4-0.6 mm in the axial direction. By making the length L4 from the front end of the insulated wire 313 to the exposed portion 313d equal to the sum total of a length $L_6$ of the insulated wire 313 required for forming a wire loop in the next wiring step and a length $L_7$ required for forming a ball 313c, it becomes possible to bring the center of the exposed portion 313d in concurrence with the bonding position on the lead 304b in the next bonding operation. Among the lengths $L_1$-$L_7$, there are geometrically relationships as follows:

$$L_4 = L_6 + L$$

$$L_1 = L_4 + L_2 - L_3$$

$$L_1 = L_6 + + L_7 + L_2 - L_3$$

The length $L_6$ of the insulated wire 313 required for forming the wire loop in the next wiring step is determined by the distance between the bonding pad 303a of the semiconductor chip 303 and the bonding position on the lead 304b to be interconnected and the height of the wire loop. The length $L_7$ used for forming the ball 313c is determined by the diameter of the core wire 313a and the diameter of the ball 313c. The lengths $L_2$ and $L_3$ are determined by initial setting of the wire bonding apparatus, and therefore, if these factors are determined, the height $L_1$ of the capillary 310 in the step of FIG. 23(e) can be obtained by calculation. The control unit 320 obtains the height $L_1$ of the capillary 310 by calculation in the step of FIG. 23(e) and brings the height of the capillary 310 to $L_1$ by suitably controlling the operation of the linear motor 308. First after the formation of the exposed portion 313d by the discharges in the step shown in FIG. 23(g), the second wire clamper 315 closes to restrict the insulated wire 313 in its movement and then the first wire clamper 314 opens. The capillary 310 descends a distance $L_8$ and stops at the position where the front end of the insulated wire 313 sticks out of the front end of the capillary 310 by a length Lg (FIG. 23(11)).

From a geometrical relationship among the lengths $L_8$, $L_9$ and $L_1$, it is obtained:

$$L_8 = L_1 - L_9.$$

The length $L_9$ is that required for forming the ball 313c at the front end of the insulated wire 313 in the next step and its suitable length is 0.5-1.0 μm in the present embodiment. Since the length $L_1$ is obtained when the earlier described various factors are determined, the $L_8$ can also be obtained by calculation. The control unit 320 sets up the length $L_8$ by suitably controlling the linear motor 308. First, the first wire clamper 314 is closed to restrict the insulated wire 313 in its movement, the second wire clamper 315 is opened, and the capillary 310 ascends to the height $L_2$ from the surface of the lead 304b and stops. At the same time, the first discharging electrode 316 enters the space right below the capillary 310 such that it confronts the front end of the insulated wire 313 projecting out of the front end of the capillary 310 across a predetermined discharge gap $L_{10}$ (FIG. 23(i)).

A discharge is produced between the front end of the insulated wire 313 and the first discharging electrode 316. Then, the insulating film 313b at the end portion of the insulated wire 313 is removed by thermal decomposition caused by energy of the discharge. At the same time, the end portion of the core wire 313a is melted and a ball 313c is formed by the surface tension of itself (FIG. 23(i)).

The first wire clamper 314 which has been closed is opened and the insulated wire 313 is pulled back by the tension produced by the back tension mechanism acting thereon in the direction of the reel 312. The ball 313c at the front end of the core wire 313a is caught by the front end of the capillary 310 and the condition of FIG. 23(a) is restored. The apparatus is now ready for the next bonding operation.

When the height of the first discharging electrode 316 from the surface of the lead 304b is represented by $L_{11}$ and the discharge gap with the front end of the insulated wire 313 is represented by $L_{10}$, it is obtained.

$$L_2 = L_9 + L_{10} + L_{11}.$$

The height $L_2$ Of the capillary 310 in the step of FIG. 23(i) can be obtained by calculation. Thus, the control unit 320 controls the linear motor 308 to set up the height $L_2$ of the capillary 310.

The discharging conditions for the first discharging electrode 316 to form the ball 313c in the present embodiment, larger current and shorter time are preferred than in the discharging conditions for the second discharging electrode 317 to form the exposed portion 313d. For example, making the polarity of the discharging electrode 316 negative relative to the exposed portion 313d, 0.5-2.0 msec of discharging period and 30-100 ma of discharge current are used.

By repeating the sequence of processes of FIG. 23(a) to FIG. 23(i), the wire bonding for electric connections by wiring the insulated wire 313 between each of the plural bonding pads 303a on the semiconductor chip 303 and each of the plural leads 304b corresponding thereto on the lead frame 304 can be performed.

Since sequences of bonding processes are cyclically performed, a detailed description at the start of the foregoing explanation was omitted for simplicity of explanation. But, in the present embodiment, it is necessary, at the start of the sequences of the bonding operations for wiring between each of the plural bonding pads 303a on each semiconductor chip 303 and each of the corresponding plural leads 304b, to have, as described above, the exposed portion 313d previously formed at a predetermined distance from the end of the insulated wire 313 according to such factors as the distance between the bonding pad 303a and the lead 304b as in the first bonding sequence.

In the present embodiment, a sequence of dummy bonding operations is performed prior to the actual bonding sequences of operations on each individual semiconductor chip 303 according to the above described sequence of operations of FIG. 23(a)-FIG. 23(j) using such a portion as a side end portion of the lead frame 304, which will be cut off and thrown away at a later sealing process and therefore has no connection with the quality of the product. By practicing such dummy bonding, it is made possible to perform the process to form the exposed portion 313d of the core wire 313a at an appropriate distance from the front end of the insulated wire 313 as shown in FIG. 23(a) according to such factors as the distance between the bonding pad 303a of the semiconductor chip 303 and the lead 304b as the first combination in the actual bonding sequence.

According to the present invention, as described above, the insulating film 313b at a certain distance from the end of the insulated wire 313 to be bonded with the lead 304b is previously removed from the insulated wire 313. Therefore, when the peripheral surface of the insulated wire 313 and the lead 304b are bonded, as shown in FIG. 23(d), the insulating film 313b does not come therebetween. The bonding is performed with the core wire 313a and the lead 304b held in direct contact. Therefore, the insulating film 313b or such foreign materials produced by thermally caused change in quality of the insulating film 313b never comes between the core wire 313a and the lead 304b or between the core wire 313a and the front end of the capillary 310.

Therefore, compared with the bonding in the prior art performed through the insulating film 313b, greater bonding strength and lower electric resistance are obtained at the bonded portion. Thus, a good bonding characteristic is obtained at the bonded portion between the peripheral surface of the core wire 313a of the insulated wire 313 and the lead 304b.

Thus, it can be prevented, for example, that the insulated wire 313 and the lead 304b are separated at the bonded portion after being assembled into a semiconductor integrated circuit device, which produces a defective product. Reliability of the quality and operation of the semiconductor integrated circuit device can be improved.

Further, trouble is prevented from occurring when foreign materials enter the wire insertion hole of the capillary 310 to clog the insertion bole of the capillary for the insulated wire 313 to pass therethrough which impairs smooth delivery and pulling of the insulated wire through the capillary. Since smooth delivery and pulling of the insulated wire 313 is performed at all times, stabilized bonding work can be continued for a long period of time.

As the consequence of the foregoing, maintenance of the wire bonding apparatus can be simplified and its operation rate improved, and thus, productivity in the wire bonding process for semiconductor integrated circuit device can be improved.

EMBODIMENT 3

Figure 25:
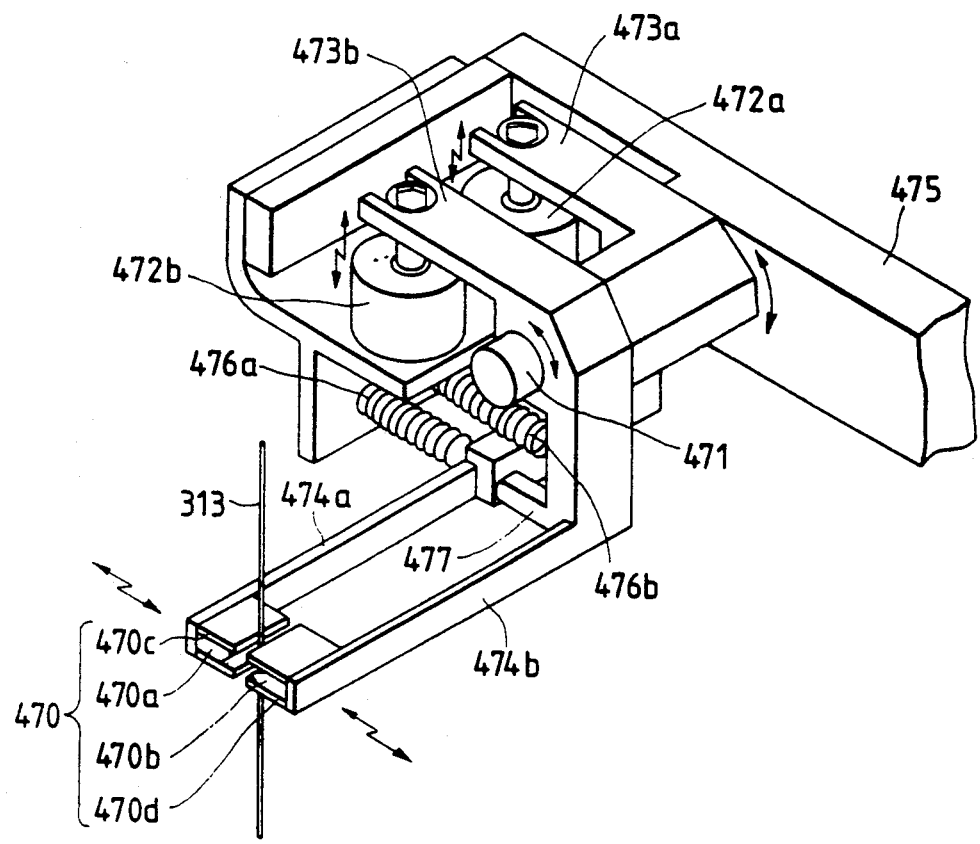
FIG. 25 is a perspective view of the major portion taken out of an apparatus for wire bonding as another embodiment of the present invention.
Figure 26:
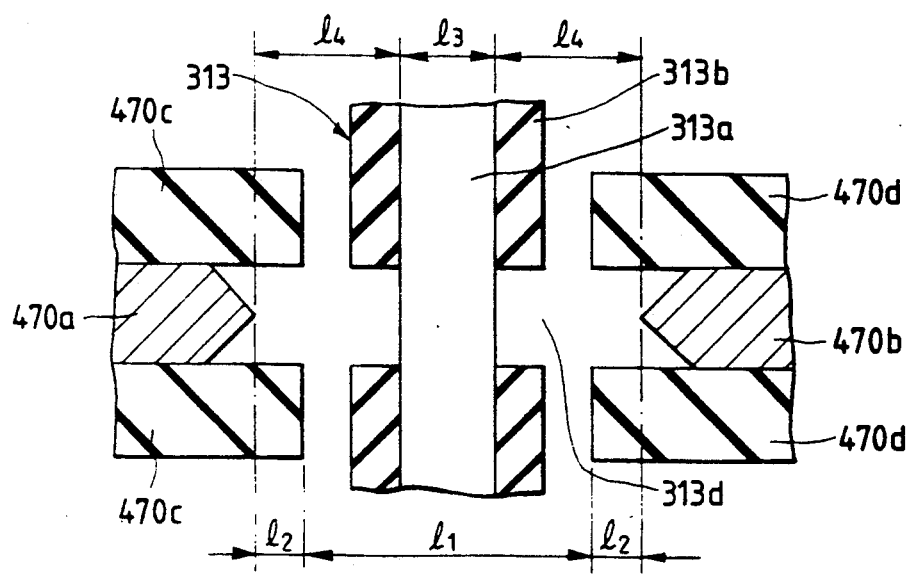
FIG. 26 is an enlarged sectional view showing a portion of the above.

FIG. 25 is a perspective view of a wire bonding apparatus as an embodiment of the present invention and FIG. 26 is an enlarged sectional view showing a portion of the same. In the wire bonding apparatus of the third embodiment, there is provided a second discharging electrode 470 for forming the exposed portion 313d at a certain distance from the end of the insulated wire 313. The second discharging electrode 470 is made of a conducting material such as tungsten (W) and comprises a pair of discharging electrodes 470a and 470b opposing each other across the insulated wire 313 and insulator pieces 470c and 470d made of an insulating material such as ceramic and fixed to the electrode pieces 470a and 470b, respectively, in such a manner that they are projecting further than the electrode pieces toward the insulated wire 313. Thus, the insulator pieces 470c and 470d prevent the pair of electrode pieces 470a and 470b opposing each other across the insulated wire 313 with a predetermined gap left therebetween from coming into direct contact with the insulated wire 313. In the present embodiment, the second discharging electrode 470 is driven by a discharging electrode driving mechanism comprising a pivoted shaft of 471 having a plurality of swing arms 473a, 473b which are coaxially supported by the shaft having ends which are connected to separate solenoids 472a, 472b, respectively, a pair of guide arms 474a, 474b, on which bases are fixed to the other ends of the swing arms 473a, 473b and front ends are connected to the pair of electrode pieces 470a, 470b of the second discharging electrode 470, and a frame member 475, which is fixed to an plurality of solenoids 472a, 472b.

Between each of the swing arms 473a and 473b and the frame member 475, there are interposed springs 476a and 476b, respectively, for providing each arm with torque constantly urging each arm to rotate in a predetermined direction.

Between the surfaces opposing each other of the end portions of the swing arms 473a and 473b for supporting the guide arms 474a and 474b, there is provided a gap adjusting piece 477 locked to the swing arm 473b. The minimum distance between the guide arms 474a and 474b brought about by approaching each other through swing displacement of the swing arms 473a and 473b, that is, the minimum distance between the pair of electrode pieces 470a and 470b of the second discharging electrode 470 is steadily maintained.

More particularly, when the second discharging electrode 470 is not in use, the solenoid 472a is relaxed so that the swing arm 473a is rotated through urging force of the spring 476a. The second solenoid 472b is activated so that the swing arm 473b is rotated against the urging force of the spring 476b, so that the electrode pieces 470a and 470b are retracted through the guide arms 474a and 474b in a direction away from each other.

In contrast, when, the solenoid 472a is activated so that the swing arm 473a is rotated to a predetermined position against the urging force of the spring 476a, its reference position is set up. In the meantime, the solenoid 472b is relaxed so that the swing arm 473b is rotated through the urging force of the spring 476b until it reaches the position where the gap adjusting piece 477 comes into abutment with the swing arm 473a on the opposite side, so that distances of the electrode piece 470a and the insulator pieces 470c, and the electrode piece 470b and the insulator pieces 470d, of the second discharging electrode 470 from the peripheral surface of the insulated wire 313 are controlled to be a predetermined value with precision.

More particularly, in the case of the present embodiment, by representing the distance between the insulator pieces 470c and 470d by $l_1$, the projection of each of the insulator pieces 470c and 470d from each of the electrode pieces 470a and 470b by $l_2$, and the diameter of the core wire 313a of the insulated wire 313 by $l_3$ as illustrated in FIG. 26, the discharge gap $l_4$ is expressed as $$l_2 < l_4 < l_2 + (l_1 - l_3)/2.$$

If, for example, $l_2 = 0.2$ mm, $l_1 = 0.1$ mm, and $l_3 = 0.03$ mm, the discharge gap $l_4$ can be precisely set from the above expression within the range $$0.02 \text{ mm} < l_4 < 0.235 \text{ mm}.$$

In the third embodiment, as described above, the discharge gap $l_4$ can be precisely set up when the exposed portion 313d is formed by discharges produced between the second discharging electrode 470 and the insulated wire 313. In addition, of shorting between the core wire 313a and the electrode pieces 470a, 470b is prevented by existence of the insulator pieces 470c, 470d. Therefore, it is made possible to cause stable discharges and have the range and position of the exposed portion 313d formed at the specified portion of the insulated wire 313 with high accuracy.

EMBODIMENT 4

FIG. 27(a) to FIG. 27(h) illustrate a method of wire bonding according to a fourth embodiment of the present invention as sequence of manufacturing steps. First, the capillary 310 is positioned right above the bonding pad 303a of the semiconductor chip 303, and at this time, the insulated wire 313 passed through the capillary 310 is restricted in its movement by the first wire clamper 314, with an end portion of a length necessary for forming a ball 313c projecting out of the front end of the capillary 310 (FIG. 27(a)). A first discharging electrode 460 comes under the insulated wire 313 with a predetermined discharge gap left therebetween and produces a discharge between the same and the front end of the insulated wire 313 to thereby form the ball 313c (FIG. 27(b)). Thereafter the first discharging electrode 460 retreats to one side, and at the same time, the capillary 310 descends a predetermined distance with only the first wire clamper 314 closed (FIG. 27(c)). At this time, the ball 313c of the insulated wire 313 is not in contact with the bonding pad 303a of the semiconductor pellet 303 thereunder. Thereafter, the capillary 310 rapidly ascends to a predetermined height with the first wire clamper 314 opened, when the insulated wire 313 is brought into a state where it is delivered from the front end of the capillary 310 a predetermined length by action of inertia of the insulated wire 313 itself. The second wire clamper 315 is closed so that the insulated wire 313 comes to a stabilized state. Then, the first discharging electrode 460 approaches the insulated wire 313 at a predetermined distance from its end from the side with a predetermined discharge gap left therefrom. Then, a discharge is produced between the first discharging electrode 460 and the core wire 313a through the insulating film 313b. By energy of the discharge at this time, the exposed portion 313d is formed on the insulated wire 313 at its position at the predetermined distance from its end (FIG. 27(d)). Thereafter, the first discharging electrode 460 retreats sideways and the second wire clamper 315 is opened. The insulated wire 313 is returned to the side of the reel 312 by action of the tension constantly exerted by the back tension mechanism on the wire so that the ball 313c at its end comes to be caught by the front end of the capillary 310 (FIG. 27(e)). Then, the capillary 310 descends onto the bonding pad 303a of the semiconductor chip 303 with both the first wire clamper 314 and the second wire clamper 315 opened and presses the ball 313c against the bonding pad 303a under vibration given thereto. Thus, the ball 313c of the insulated wire 313 is compression bonded to the bonding pad 303a (FIG. 27(f)). Thereafter, the capillary 310 ascends to the height where its front end coincides with the position of the exposed portion 313d which was already formed in the previous step of FIG. 27(d), travels to the side, descends toward the target lead 304b and presses the peripheral surface of the core wire 313a exposed at the exposed portion 313d against the surface of the lead 304b, with ultrasonic vibration applied thereto, to thereby compression bond it to the lead (FIG. 27(g)).

Figures 27E, 27F, 27G, 27H:
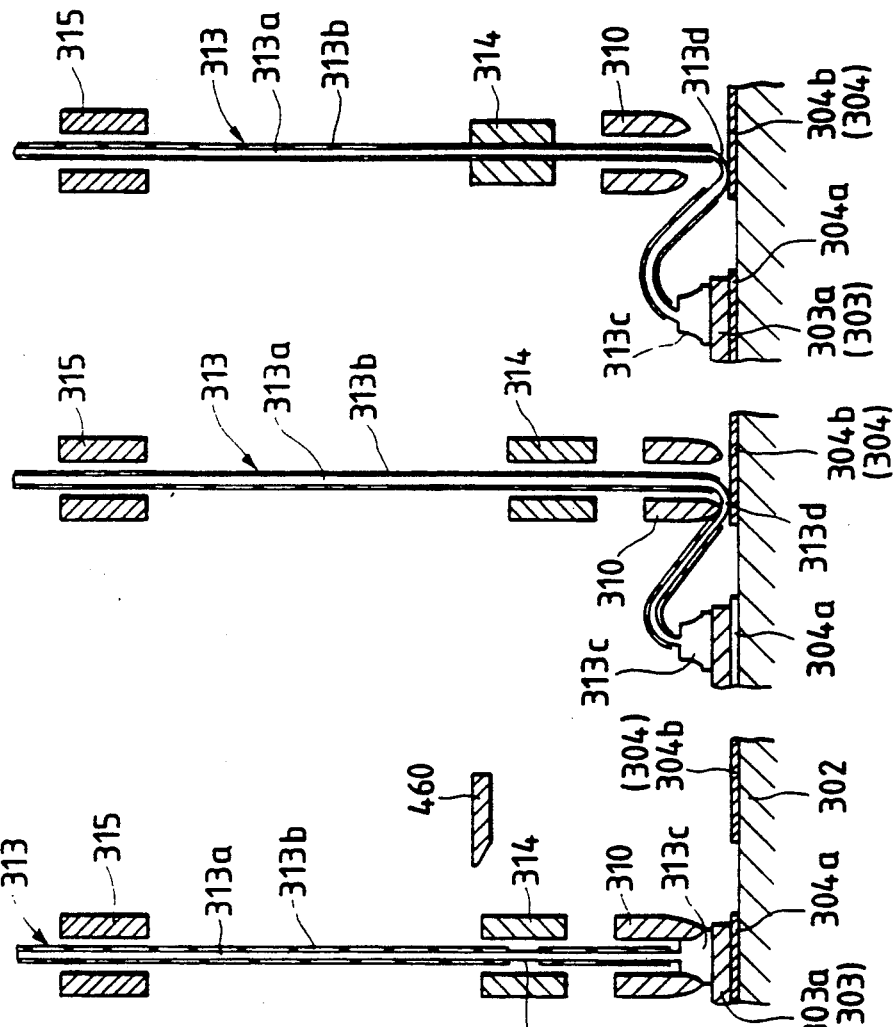

Since with of the present embodiment as with the first embodiment no insulating film 313b between the peripheral surface of the core wire 313a and the surface of the lead 304b, sufficient bonding strength can be obtained, and highly reliable bonding work can be performed. Further, there occurs no change in insulating film 313b attaching to the front end portion of the capillary 310. Then, the capillary 310 is elevated to a height that the length of the insulated wire 313 necessary for forming the ball 313c is drawn out and stopped. The first wire clamper 314 is closed so that the insulated wire 313 is prevented from being drawn out. The capillary 310 is further elevated so that the front end portion of the insulated wire 313 is broken at the bonded position with the lead 304b (FIG. 27(h)). Then, the capillary 310 is positioned at, a predetermined height right above the bonding pad 303a of the semiconductor pellet 303 to be bonded in the next position to thereby bring the apparatus ready for the next bonding operation. Thus, the condition illustrated in FIG. 27(a) is restored and the sequence of bonding operations for one set of bonding pad 303a and lead 304b is finished.

Since with the present embodiment, the same conditions exist as with the second embodiment, no insulating film 313b comes between the peripheral surface of the core wire 313a and the surface of the lead 304b. As a result, sufficient bonding strength can be obtained and highly reliable bonding work can be performed. Further, since no insulating film, 313b attaches to the front end portion of the capillary 310, the operations for delivering and pulling the insulated wire 313 through the capillary 310 are smoothly performed at all times and stabilized bonding operations can be continued for a long period of time.

Further, with the present embodiment, the length of the insulated wire 313 drawn out for forming the exposed portion 313d can be controlled by the vertical movement of the capillary 310, without making use of the bond of the front end of the insulated wire 313 with the lead 304b. Therefore, the need for the dummy bonding operation as in the case of the embodiment 2 can be eliminated.

While the invention has been particularly described with reference to preferred embodiments thereof, it is to be understood that the present invention is not limited to the above described embodiments. Various modifications may be made in the invention without departing from the spirit thereof.

Effects obtainable from representative aspects of the invention described above in its preferred embodiment will be described as follows. The wire bonding method according to the present invention is a method in which an insulated wire passed through a bonding tool is used, and the operation to bond the front end of the insulated wire to a first position and the operation to bond the periphery of the insulated wire drawn out of the bonding tool to a second position are performed to thereby achieve an electrical connection between the first position and the second position. In this method, the insulated wire is drawn out of the front end of the bonding tool with a required length calculated based on information on positions of the first and the second positions, and a discharge is produced between the core wire of the insulated wire and the discharging electrode through the insulating film at the portion of the wire to be bonded to the second position, so that the insulating film is removed by energy of the discharge at that time. The exposed portion of the core wire is formed, and the exposed portion is bonded to the second position. Therefore, it is made possible to perform the bonding operation with the core wire exposed at the exposed portion and the second position held in direct contact. Hence, lowering of the reliability on the bonded portion due to the insulating film material coming between the core wire and the second position is eliminated. The reliability of the bonded position between the periphery of the insulated wire and the second position is increased.

Further, since the insulating film does not come between the core wire and the second position, any foreign material resulting from peeling off and thermally produced change in the quality of the insulating film are greatly reduced. Since the bonding tool presses the core wire of the insulated wire exposed at the exposed portion directly to the second position, there occur no foreign materials enter into the bonding tool. Smooth passing of the insulated wire through the bonding tool is assured and stabilized continuation of the bonding operations is made possible.

The apparatus for wire bonding according to the present invention comprises a bonding tool, through which an insulated wire is passed and which makes three dimensional movement relative to an aimed target, and a discharging electrode producing necessary discharges between the electrode and the insulated wire. By performing a process to bond the front end of the insulated, wire where a ball has been formed by the discharge to a first position and a process to bond a peripheral portion of the insulated wire drawn out of the bonding tool to a second position, achieves an electrical connection between the first position and the second position is achieved. In this apparatus, the length of the insulated wire to be wired between the first and second positions is calculated based on information on positions of the first and second positions. The required length of the insulated wire is drawn out of the front end of the bonding tool based on the result of the calculation. An exposed portion of the core wire is formed at the portion to be bonded to the second position by producing a discharge between the core wire of the insulated wire and the discharging electrode to eliminate the insulating film by energy of the discharge at that time. This exposed portion is bonded to the second position. Therefore, by suitably controlling first and second independently movable clamps, the drawing out of the insulated wire from the bonding tool is controlled. The exposed portion of the core wire can be formed by removing the insulating film at the portion to be bonded to the second position at any desired distance from the end of the insulated wire prior to the bonding of the peripheral portion of the insulated wire to the second position. Thus, the bonding operation can be performed with the core wire exposed at the exposed portion and the second position placed into direct contact. Hence, lowering of the reliability of the bonded portion due to the insulating film coming between the core wire and the second position is be eliminated and the reliability of the bonded portion between the periphery of the insulated wire and the second position is improved.

Further, since no insulating film comes between the core wire and the second position, production of foreign materials resulting from peeling off or thermally caused change in quality of the insulating film can be greatly reduced. In addition, since the bonding tool can press the core wire of the insulated wire exposed at the exposed portion formed in advance directly to the second position, no foreign material gets into the bonding tool. Smooth passing of the insulated wire through the bonding tool is assured and stabilized continuation of the bonding operations is made possible

What is claimed is:

1. A wire bonding method for bonding a bonding wire which is coated with an insulation film over a length of the wire comprising:
    (a) placing an integrated circuit chip, having first and second major surfaces, and a plurality of leads onto a bonding stage of a wire bonding pads on the first major surface;
    (b) forming a ball on one tip of the wire by a first electrical discharge between the one tip of the wire and a first discharge electrode of the bonding apparatus while the one tip of the wire protrudes out of one end of a bonding capillary of the bonding apparatus;
    (c) removing the insulation film of the wire over a predetermined length at an intermediate portion of the wire by a second electrical discharge between the intermediate portion of the wire and the first or a second discharge electrode of the bonding apparatus while the one tip of the wire protrudes out of the one end of the bonding capillary of the bonding apparatus, and the intermediate portion is located at a position displaced a predetermined length from the one tip of the wire toward another tip of the wire;
    (d) after steps (b) and (c), ball-bonding the one tip of the wire to one of the bonding pads by pressing the ball against the one of the bonding pads with the bonding capillary; and
    (e) after steps (b), (c) and (d), wedge-bonding the intermediate portion of the wire to one of the leads by pressing the intermediate portion of the wire against the one of the leads with the capillary.

2. A wire bonding method according to claim 1 wherein:
    step (c) is performed while keeping the one tip of the wire protruding out of the bonding capillary away from the chip so as to not touch the chip or any one of the bonding pads during the second discharge.

3. A wire bonding method according to claim 1 wherein:

step (c) is performed after step (b).

4. A wire bonding method according to claim 3 wherein:
step (c) is performed while keeping the one tip of the wire protruding out of the bonding capillary away form the chip so as to not touch the chip or any one of the bonding pads during the second discharge 5. A wire bonding method according to claim 1 wherein:
step (b) is performed after step (c).

6. A wire bonding method according to claim 5 wherein:
step (c) is performed while keeping the one tip of the wire protruding out of the bonding capillary away from the chip so as to not touch the chip or any one of the bonding pads during the second discharge.

7. A wire bonding method for bonding a bonding wire which is coated with an insulation film over a length of the wire comprising:
(a) placing an integrated circuit chip having first and second major surfaces, and a plurality of leads onto a bonding stage of a wire bonding apparatus with the chip having a plurality of bonding pads on the first major surface;
(b) forming a ball on one tip of the wire by a first electrical discharge between the one tip of the wire and a first discharge electrode of the bonding apparatus while the one tip of the wire protrudes out of one end of a bonding capillary of the bonding apparatus;
(c) removing the insulation film of the wire over a predetermined length at an intermediate portion of the wire by a second electrical discharge while the one tip of the wire protrudes out of the one end of the bonding capillary of the bonding apparatus and the intermediate portion is located at a position displaced a predetermined length from the one tip of the wire toward another tip of the wire;
(d) after steps (b) and (c), ball-bonding the one tip of the wire to one of the bonding pads by pressing the ball against the one of the bonding pads with the bonding capillary; and
(e) after steps (b), (c) and (d), wedge-bonding the intermediate portion of the wire to one of the leads by pressing the intermediate portion of the wire against the one of the leads with the capillary.

8. A wire bonding method according to claim 7 wherein:
step (c) is performed while keeping the one tip of the wire protruding out of the bonding capillary away from the chip so as to not touch the chip or any one of the bonding pads during the second discharge.

9. A wire bonding method according to claim 7 wherein:
step (c) is performed after step (b).

10. A wire bonding method according to claim 9 wherein:
step (c) is performed while keeping the one tip of the wire protruding out of the bonding capillary away from the chip so as to not touch the chip or any one of the bonding pads during the second discharge.

11. A wire bonding method according to claim 7 wherein:
step (b) is performed after step (c).

12. A wire bonding method according to claim 11 wherein:
step (c) is performed while keeping the one tip of the wire protruding out of the bonding capillary away from the chip so as to not touch the chip or any one of the bonding pads during the second discharge.

* * * * *